United States Patent
Sharma et al.

(10) Patent No.: US 12,432,897 B2
(45) Date of Patent: Sep. 30, 2025

(54) COOLING APPROACHES FOR STITCHED DIES

(71) Applicant: Intel Corporation, Santa Clara, CA (US)

(72) Inventors: Abhishek Anil Sharma, Portland, OR (US); Wilfred Gomes, Portland, OR (US); Christopher M. Pelto, Beaverton, OR (US); Mark C. Phillips, Portland, OR (US); Swaminathan Sivakumar, Beaveton, OR (US)

(73) Assignee: Intel Corporation, Santa Clara, CA (US)

( * ) Notice: Subject to any disclaimer, the term of this patent is extended or adjusted under 35 U.S.C. 154(b) by 768 days.

(21) Appl. No.: 17/561,675

(22) Filed: Dec. 23, 2021

(65) Prior Publication Data

US 2023/0209800 A1    Jun. 29, 2023

(51) Int. Cl.
*H10B 10/00* (2023.01)
*G11C 5/14* (2006.01)
*G11C 11/412* (2006.01)
*H01L 23/42* (2006.01)

(52) U.S. Cl.
CPC ............ *H10B 10/18* (2023.02); *G11C 11/412* (2013.01); *H01L 23/42* (2013.01); *G11C 5/141* (2013.01)

(58) Field of Classification Search
CPC ............ H01L 25/0652; H01L 25/0655; H01L 23/473
See application file for complete search history.

(56) References Cited

U.S. PATENT DOCUMENTS

2021/0366819 A1\* 11/2021 Chiang ............... H01L 23/3675

\* cited by examiner

*Primary Examiner* — Shih Tsun A Chou
(74) *Attorney, Agent, or Firm* — Schwabe, Williamson & Wyatt, P.C.

(57) ABSTRACT

Stitched dies having a cooling structure are described. For example, an integrated circuit structure includes a first die including a first device layer and a first plurality of metallization layers over the first device layer. The integrated circuit structure also includes a second die including a second device layer and a second plurality of metallization layers over the second device layer, the second die separated from the second die by a scribe region. A common conductive interconnection is coupling the first die and the second die at a first side of the first and second dies. A plurality of microfluidic channels is coupled to the first side of the first and second dies.

22 Claims, 19 Drawing Sheets

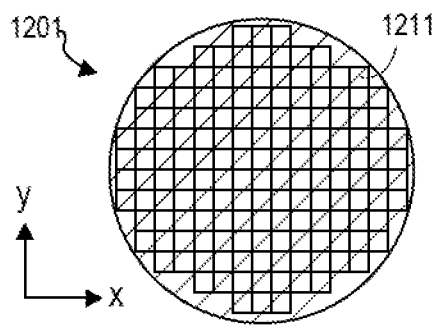
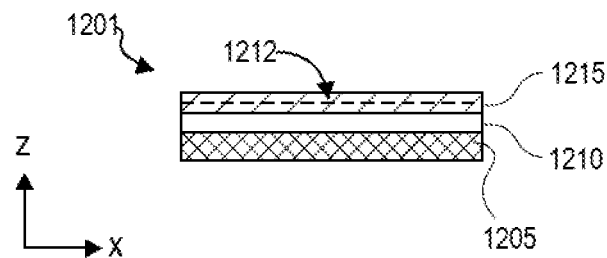
FIG. 12A  FIG. 13A
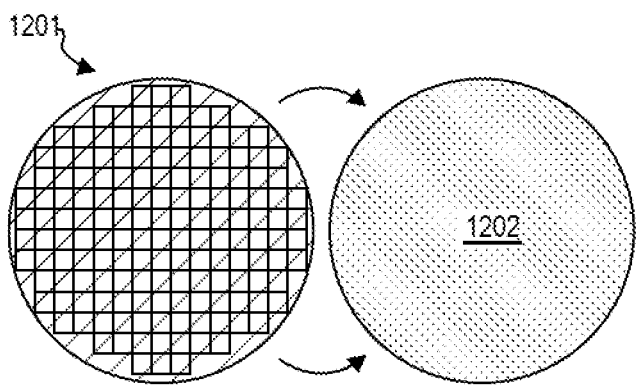
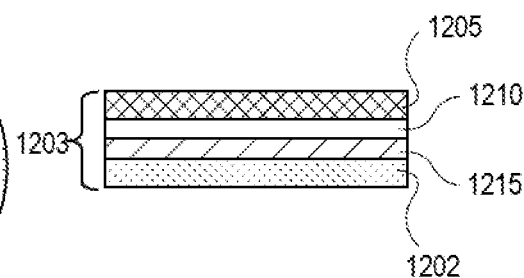
FIG. 12B  FIG. 13B
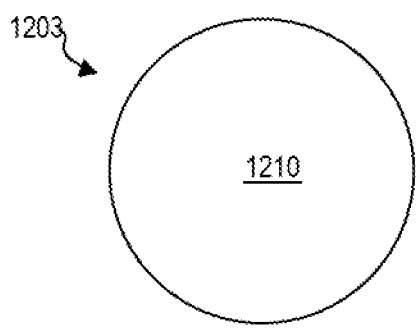
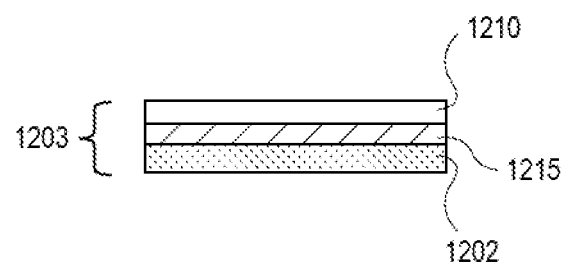
FIG. 12C  FIG. 13C

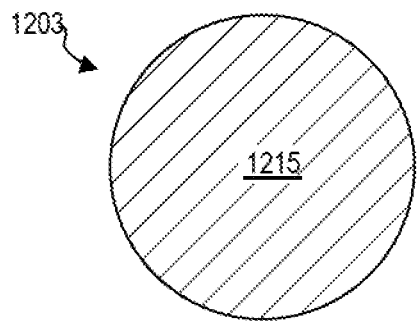
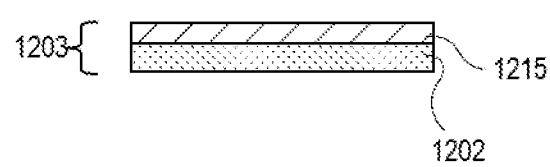
FIG. 12D     FIG. 13D
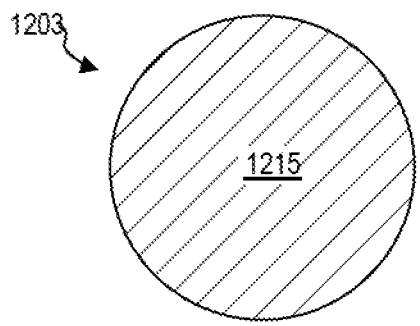
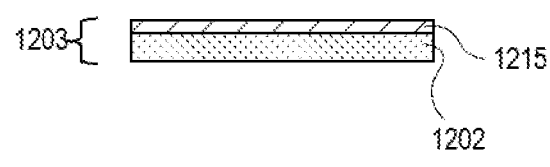
FIG. 12E     FIG. 13E
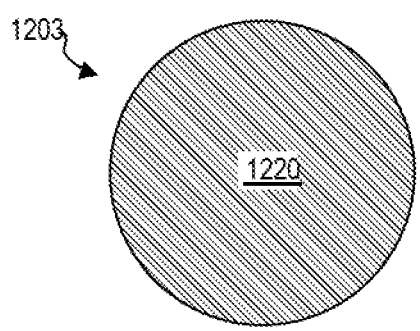
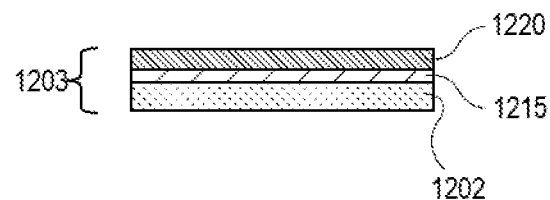
FIG. 12F     FIG. 13F

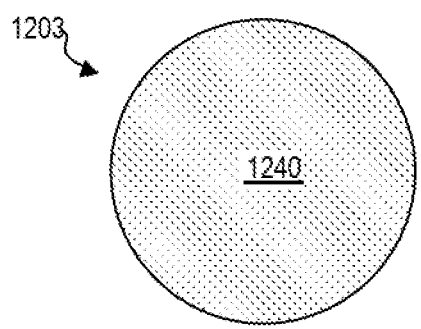
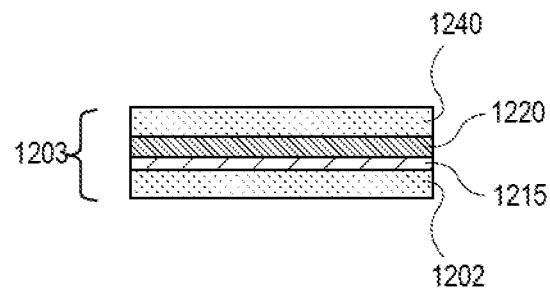
FIG. 12G  FIG. 13G
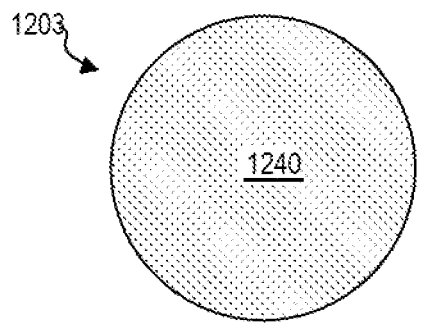
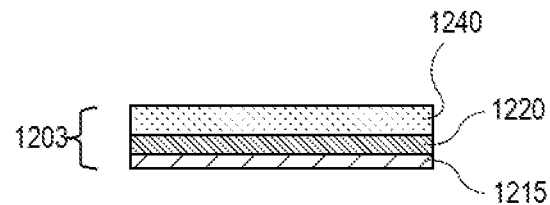
FIG. 12H  FIG. 13H

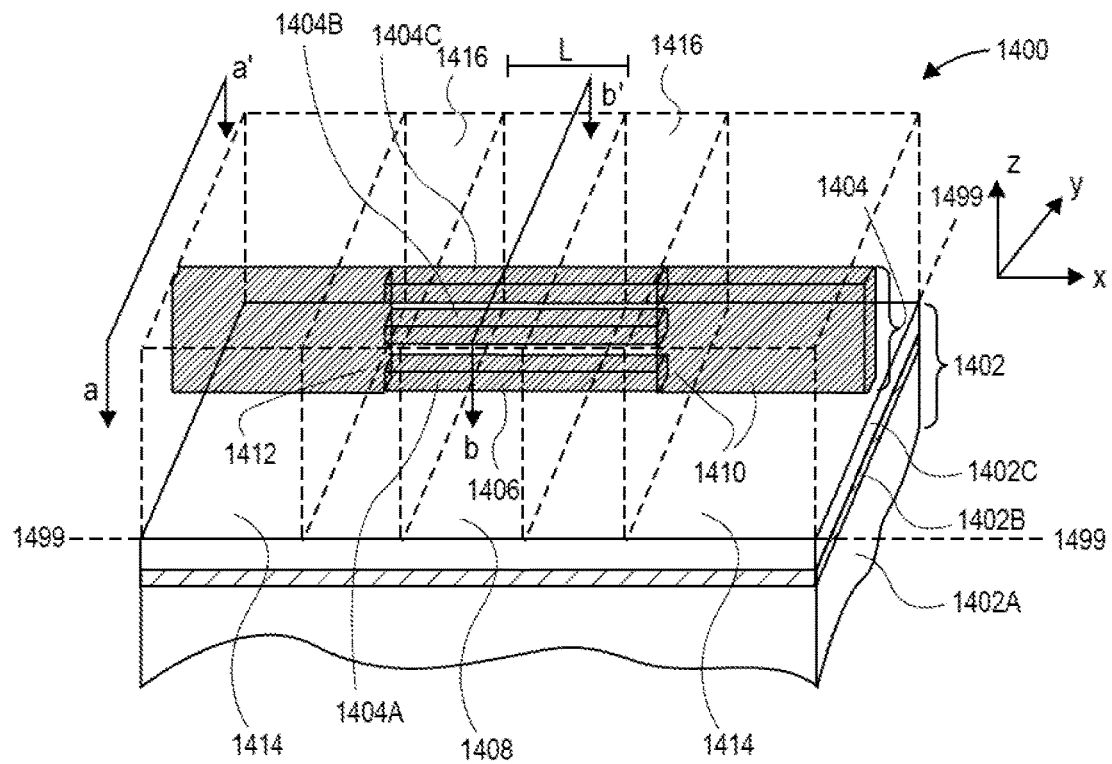
FIG. 14A
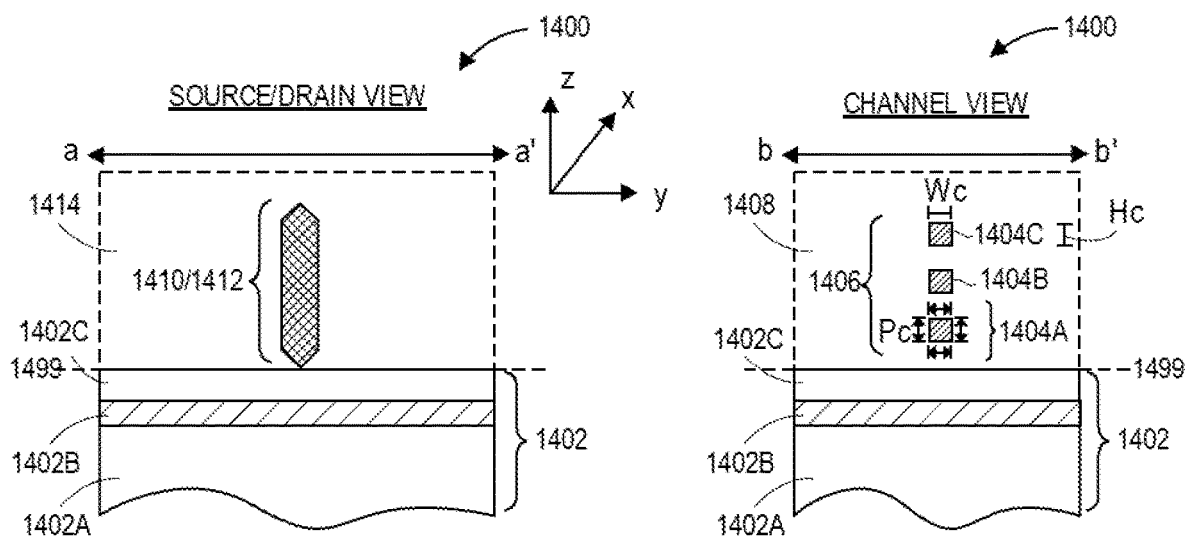
FIG. 14B  FIG. 14C

COOLING APPROACHES FOR STITCHED DIES

TECHNICAL FIELD

Embodiments of the disclosure are in the field of integrated circuit structures and processing and, in particular, stitched dies having cooling structures.

BACKGROUND

In one aspect, the demand for miniaturization of form factor and increased levels of integration for high performance are driving sophisticated packaging approaches in the semiconductor industry. One such approach is to use die partitioning to enable miniaturization of small form factor and high performance. Such architectures depend on fine die-to-die interconnects to couple the partitioned dies together.

In another aspect, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and because they enable a less complicated tri-gate fabrication process. In another aspect, maintaining mobility improvement and short channel control as microelectronic device dimensions scale below the 10 nanometer (nm) node provides a challenge in device fabrication. Nanowires used to fabricate devices provide improved short channel control.

Scaling multi-gate and nanowire transistors has not been without consequence, however. As the dimensions of these fundamental building blocks of microelectronic circuitry are reduced and as the sheer number of fundamental building blocks fabricated in a given region is increased, the constraints on the lithographic processes used to pattern these building blocks have become overwhelming. In particular, there may be a trade-off between the smallest dimension of a feature patterned in a semiconductor stack (the critical dimension) and the spacing between such features.

BRIEF DESCRIPTION OF THE DRAWINGS

FIGS. 12A-12H illustrate plan views of a substrate processed with double-sided device processing methods, in accordance with some embodiments.

FIGS. 13A-13H illustrate cross-sectional views of a substrate processed with double-sided device processing methods, in accordance with some embodiments.

FIG. 14A illustrates a three-dimensional cross-sectional view of a nanowire-based integrated circuit structure, in accordance with an embodiment of the present disclosure.

FIG. 14B illustrates a cross-sectional source or drain view of the nanowire-based integrated circuit structure of FIG. 14A, as taken along an a-a' axis, in accordance with an embodiment of the present disclosure.

FIG. 14C illustrates a cross-sectional channel view of the nanowire-based integrated circuit structure of FIG. 14A, as taken along the b-b' axis, in accordance with an embodiment of the present disclosure.

DESCRIPTION OF THE EMBODIMENTS

Figure 1:
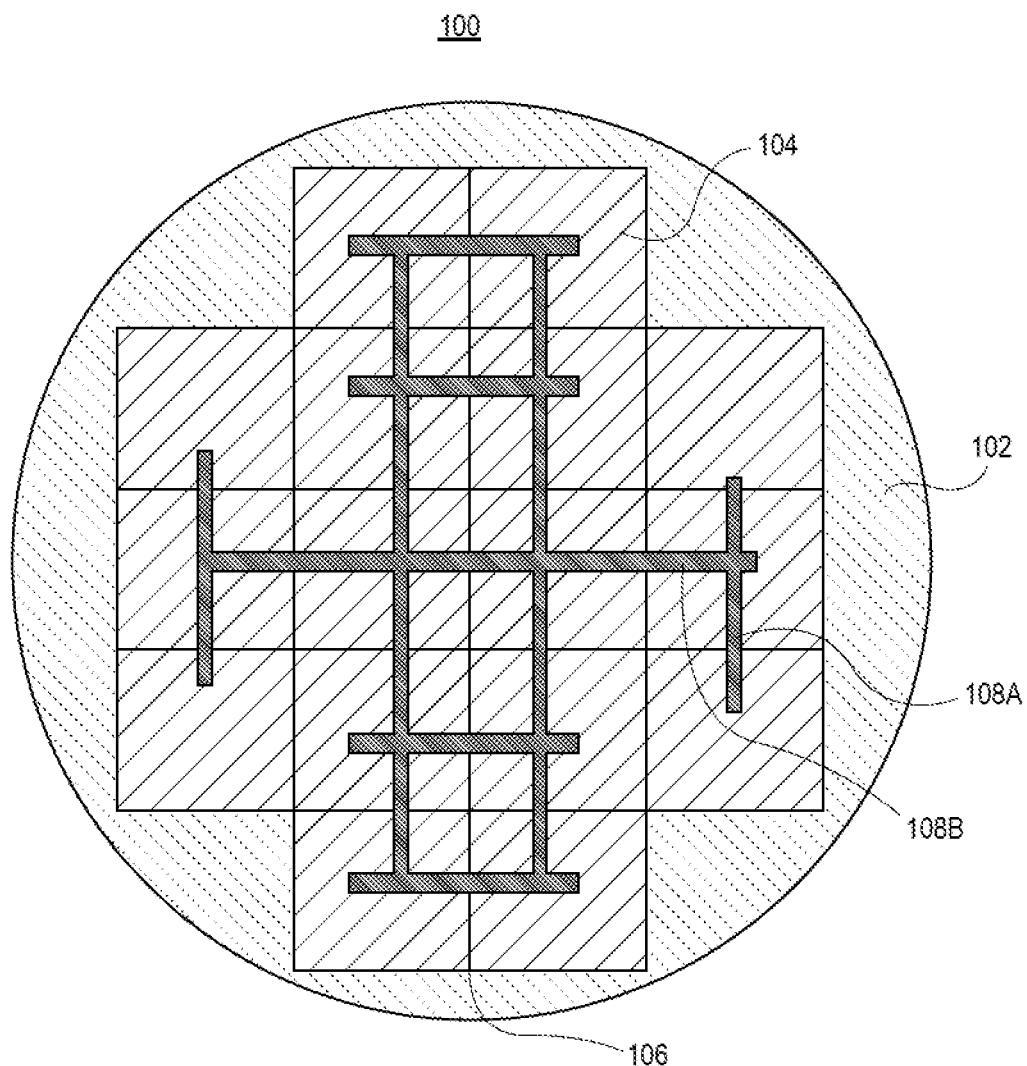
FIG. 1 illustrates a plan view of a full wafer engine, in accordance with an embodiment of the present disclosure.

Stitched dies having cooling structures are described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back-end-of-line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments described herein are directed to cooling solutions for enabling wafer-scale compute engines.

To provide context, connections can be made across reticles for heterogeneous or similar dies. This can be implemented on a wafer scale or for an extended dies architecture.

As a first example, FIG. 1 illustrates a plan view of a full wafer engine, in accordance with an embodiment of the present disclosure. Referring to FIG. 1, a full wafer engine(s) architecture 100 includes a plurality of dies 104 within a wafer 102, such as a silicon wafer. The dies 104 are separated from one another by scribe lines 106. Each scribe line 106 may not actually be scribed or trenched, but rather can be distinct regions between neighboring dies where die features do not overlap with one another. Conductive interconnections 108A/108B, such as conductive lines or bars electrically couple the dies 104. In one embodiment, the conductive interconnections 108A/108B include connections 108A along a first direction and connections 108B along a second direction, the second direction orthogonal to the first direction, as is depicted.

Figure 2:
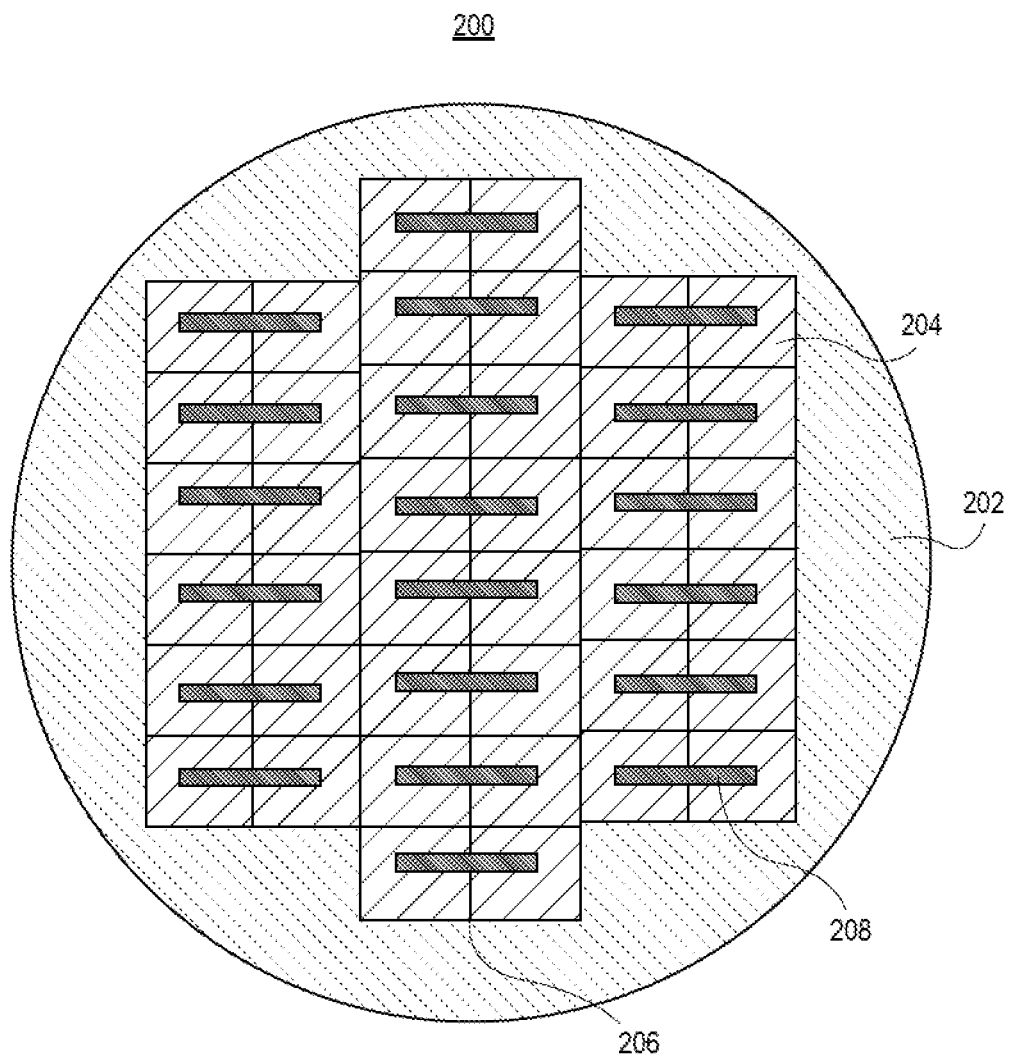
FIG. 2 illustrates a plan view of multi-die stitches, in accordance with an embodiment of the present disclosure.

As a second example, FIG. 2 illustrates a plan view of a multi-die stitches, in accordance with an embodiment of the present disclosure. Referring to FIG. 2, a multi-die stitches architecture 200 includes a plurality of dies 204 within a wafer 202, such as a silicon wafer. The dies 204 are separated from one another by scribe lines 206. Each scribe line 206 may not actually be scribed or trenched, but rather can be distinct regions between neighboring dies where die features do not overlap with one another. Conductive interconnections 208, such as conductive lines or bars electrically couple pairs of the dies 204. In one embodiment, the conductive interconnections 208 include connections that are all along a same direction, as is depicted.

Figure 3:
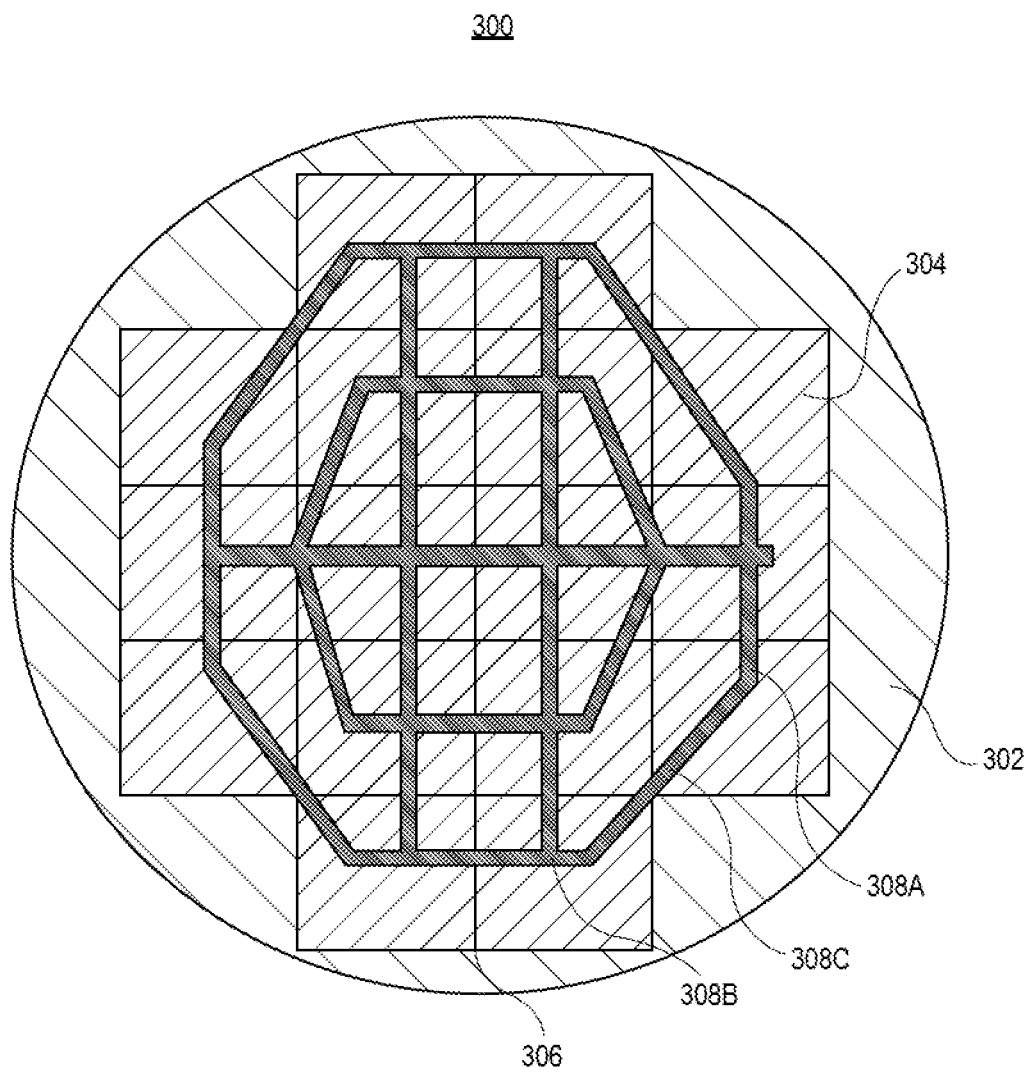
FIG. 3 illustrates a plan view of a redundant link, in accordance with an embodiment of the present disclosure.

As a third example, FIG. 3 illustrates a plan view of a redundant link, in accordance with an embodiment of the present disclosure. Referring to FIG. 3, a redundant link architecture 300 includes a plurality of dies 304 within a wafer 302, such as a silicon wafer. The dies 304 are separated from one another by scribe lines 306. Each scribe line 306 may not actually be scribed or trenched, but rather can be distinct regions between neighboring dies where die features do not overlap with one another. Conductive interconnections 308A/308B/308C, such as conductive lines or bars electrically couple the dies 304. In one embodiment, the conductive interconnections 308A/308B/308C include connections 308A along a first direction, connections 308B along a second direction, the second direction orthogonal to the first direction, and connections 308C running at an angle between the first and second directions, as is depicted.

Figure 4:
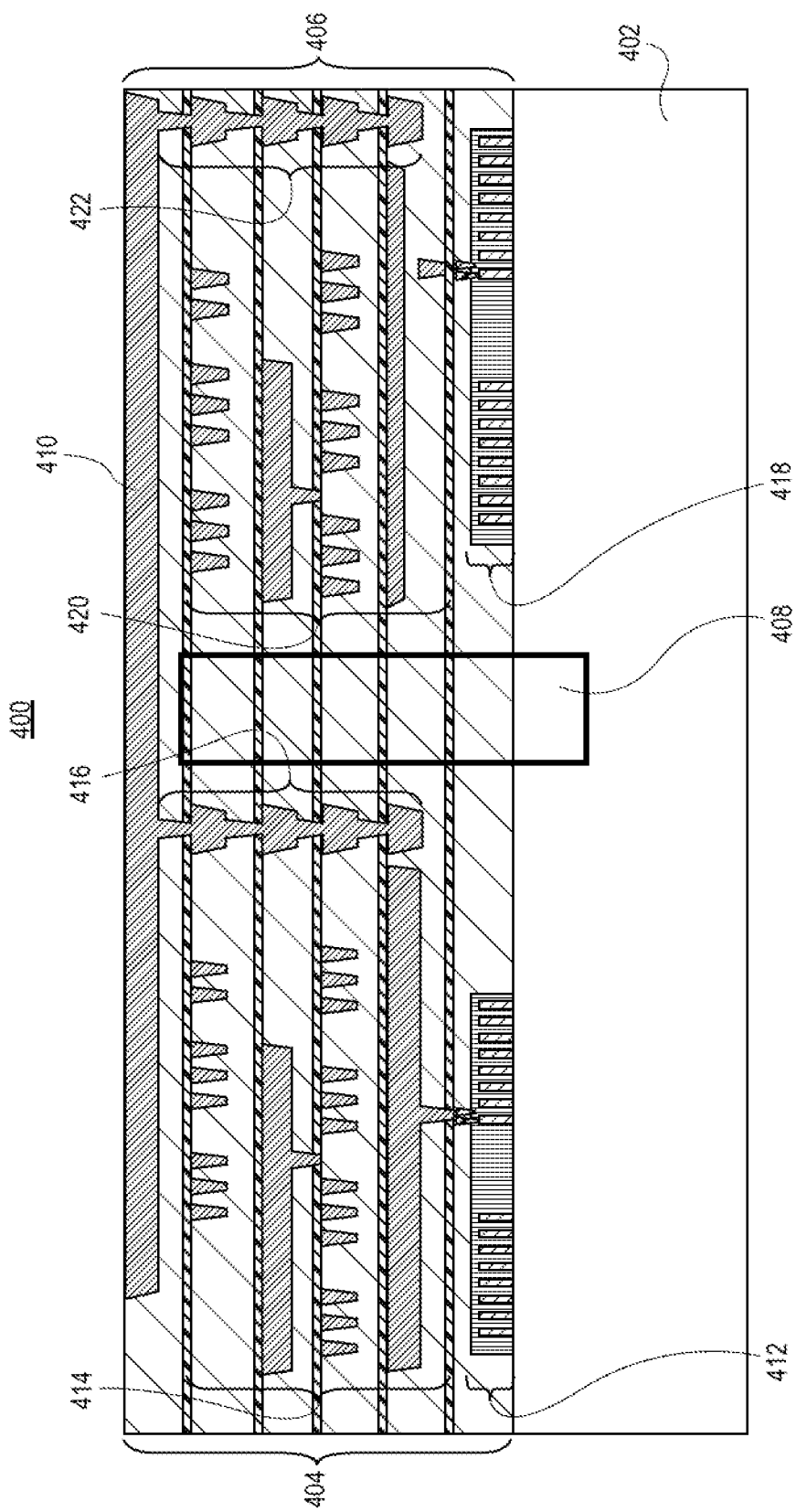
FIG. 4 illustrates a cross-sectional view of a pair of stitched dies coupled by a conductive interconnection, in accordance with an embodiment of the present disclosure.

As described above in association with FIGS. 1-3, a structure included a plurality of dies, which may be separated by scribe regions but not actually scribed, can be coupled by conductive interconnections. As an exemplary structure including dies coupled by a common conductive interconnection, FIG. 4 illustrates a cross-sectional view of a pair of stitched dies coupled by a conductive interconnection, in accordance with an embodiment of the present disclosure. The cross-sectional view of FIG. 4 may be applicable to any of the plan views of FIGS. 1-3. It is to be appreciated that while only two dies are depicted, additional stitched dies can be included in a larger architecture.

Referring to FIG. 4, an integrated circuit structure 400 includes a first die 404 and a second die 406 included on a substrate 402, such as a silicon substrate. The dies 404 and 406 are separated from one another by a scribe line 408. The scribe line 408 may not actually be scribed or trenched, but rather can be a distinct region between neighboring dies 404 and 406 where die features do not overlap with one another, as is depicted. First die 404 includes a device layer 412, and second die 406 includes a device layer 418. First die 404 includes a plurality of metallization layers 414 above device layer 412, and second die 406 includes a plurality of metallization layers 420 above device layer 418. A common conductive interconnection 410 couples the first die 404 and the second die 406. In one embodiment, the common conductive interconnection 410 is coupled to the plurality of metallization layers 414 of the first die by a first via stack 416, and the common conductive interconnection 410 is coupled to the plurality of metallization layers 420 of the second die by a second via stack 422, as is depicted.

In an embodiment, device layer 412 is similar to device layer 418. In one such, embodiment, both devices layers 412 and 418 are SRAM device layers or logic device layers. In another embodiment, device layer 412 is different than device layer 418. In one such, embodiment, device layer 412 is an SRAM device layer, and device layer 418 is a logic device layer. It is to be appreciated that, although depicted as common conductive interconnection 410 as being in a single metallization layer in accordance with one embodiment, in other embodiments a common conductive interconnection 410 is formed in multiple metallization layers.

It is to be appreciated that in other embodiments, scribed dies can be stitched together. As an exemplary structure including physically scribed dies, FIG. 5 illustrates a cross-sectional view of a pair of scribed dies that can ultimately be stitched or coupled by a conductive interconnection, in accordance with an embodiment of the present disclosure.

Figure 5:
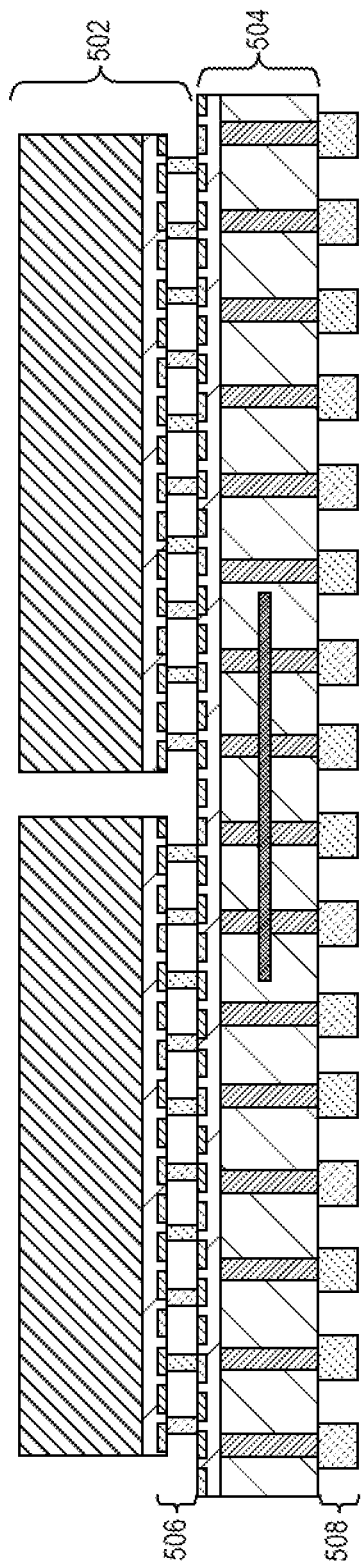
FIG. 5 illustrates a cross-sectional view of a pair of scribed dies that can ultimately be stitched or coupled by a conductive interconnection, in accordance with an embodiment of the present disclosure.

Referring to FIG. 5, an integrated circuit structure 500 includes a plurality of singulated or scribed dies 502 (two shown) coupled to an interposer 504, e.g., by interconnects 506. The interposer 504 can include through connections that couple to external interconnects 508, e.g., for coupling to a board. The dies 502 can ultimately be coupled to one another by an overlying common conductive interconnect or a plurality of common conductive interconnect, such as described in association with FIGS. 1-4. As such, although the dies 502 are singulated along a scribe line, they can ultimately be stitched together on a side of the dies 502 opposite the interposer 504.

In accordance with one or more embodiments of the present disclosure, a structure including a plurality of stitched dies has a cooling structure coupled to the stitched dies. Advantages to implementing one or more of the embodiments described herein can include a lack of need for a package.

Figure 6A:
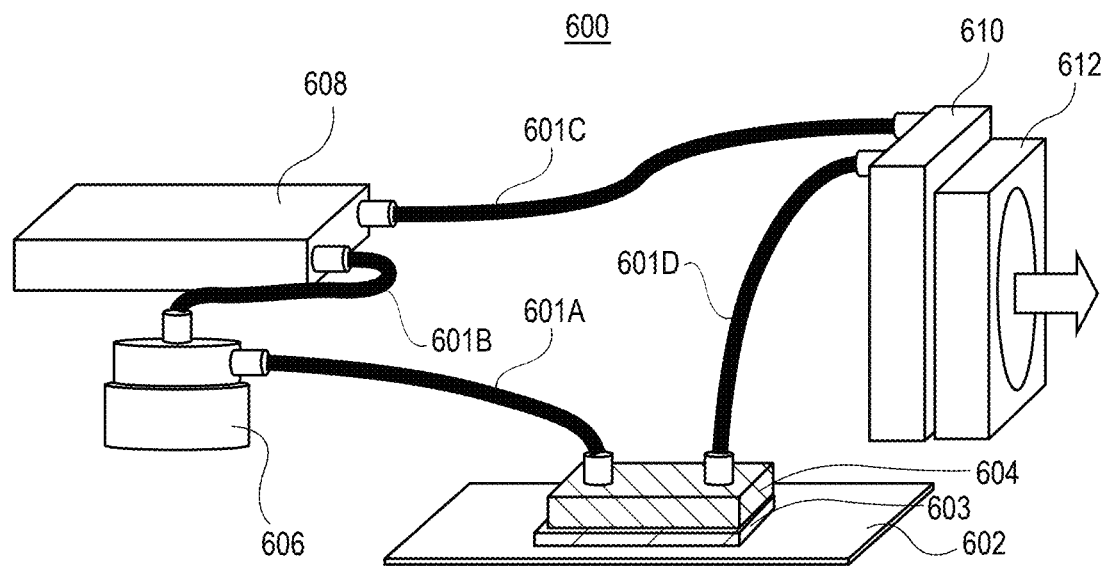
FIG. 6A is a schematic illustrating a stitched die structure coupled to a cooled heat spreader, in accordance with an embodiment of the present disclosure.
Figure 6B:
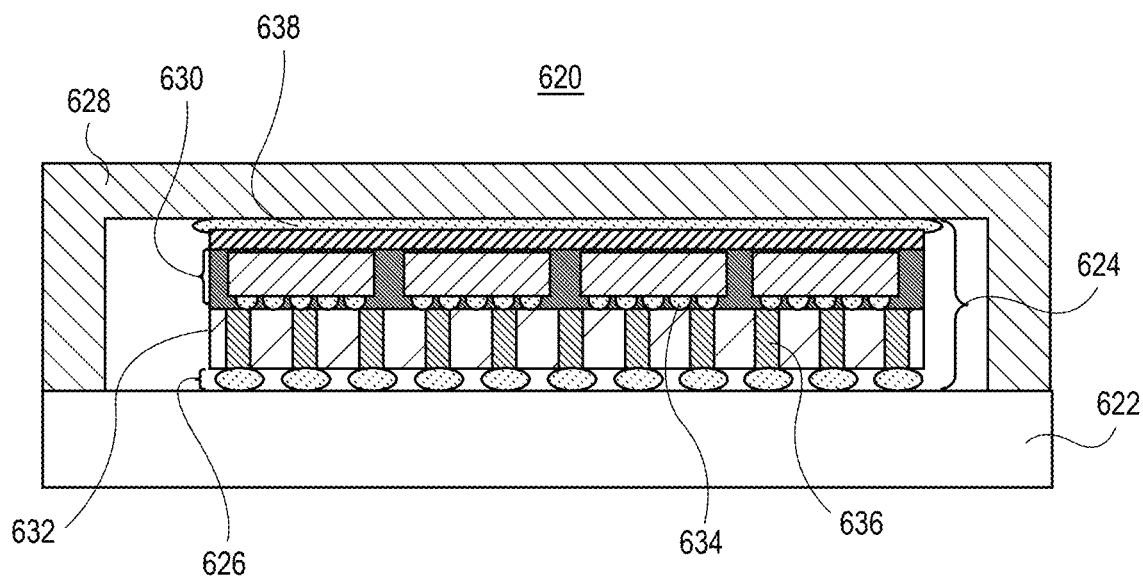
FIG. 6B illustrates a cross-sectional view of a stitched die structure coupled to a heat spreader, in accordance with an embodiment of the present disclosure.

As first exemplary structures including a common cooling solution, FIG. 6A is a schematic illustrating a stitched die structure coupled to a cooled heat spreader, in accordance with an embodiment of the present disclosure. FIG. 6B illustrates a cross-sectional view of a stitched die structure coupled to a heat spreader, in accordance with an embodiment of the present disclosure. Cooling solutions of FIGS. 6A and 6B may be applicable to any of the structures of FIGS. 1-5.

Referring to FIG. 6A, a system 600 includes a stitched die structure 603 coupled to a board or substrate 602. A heat spreader 604 is over the stitched die structure 603. The heat spreader 604 is coupled to a pump 606 by a connector 601A. The pump 606 is coupled to a reservoir 608 by a connector 601B. The reservoir 608 is coupled to a heat exchanger 610 by a connector 601C. The heat exchanger 610 is coupled to a fan 612, and is coupled to the heat spreader 604 by a connector 601D. The fan 612 removes heat generated by or at the stitched die structure 603, as is indicated by the arrow.

FIG. 6B, an apparatus 620 includes a board or substrate 622. A stitched die assembly 624 is coupled to the board or substrate 622, e.g., by interconnects 626. A heat spreader 628 is over the stitched die assembly 624. The stitched die assembly 624 includes a stitched die structure 630 coupled to an interposer 632, e.g., by interconnects 634. The interposer 632 can include through-interposer via structures or via bars 636, e.g., for coupling the interconnects 634 to the interconnects 626. The heat spreader 628 can be used to remove heat generated by or at the stitched die structure 630. The heat spreader 628 can be coupled to the stitched die structure 630 by a solder or other thermal interface material 638, as is depicted.

With reference again to FIGS. 4, 6A and 6B, in accordance with an embodiment of the present disclosure, an integrated circuit structure includes a first die 404 including a first device layer 412 and a first plurality of metallization layers 414 over the first device layer 412. The integrated circuit structure also includes a second die 406 including a second device layer 418 and a second plurality of metallization layers 420 over the second device layer 418. The second die 404 is separated from the second die 406 by a scribe region 408. A common conductive interconnection 410 is coupling the first die 404 and the second die 406 at a first side of the first 404 and second 406 dies. A heat spreader 604 or 628 is coupled to the first side of the first and second dies.

Figure 6C:
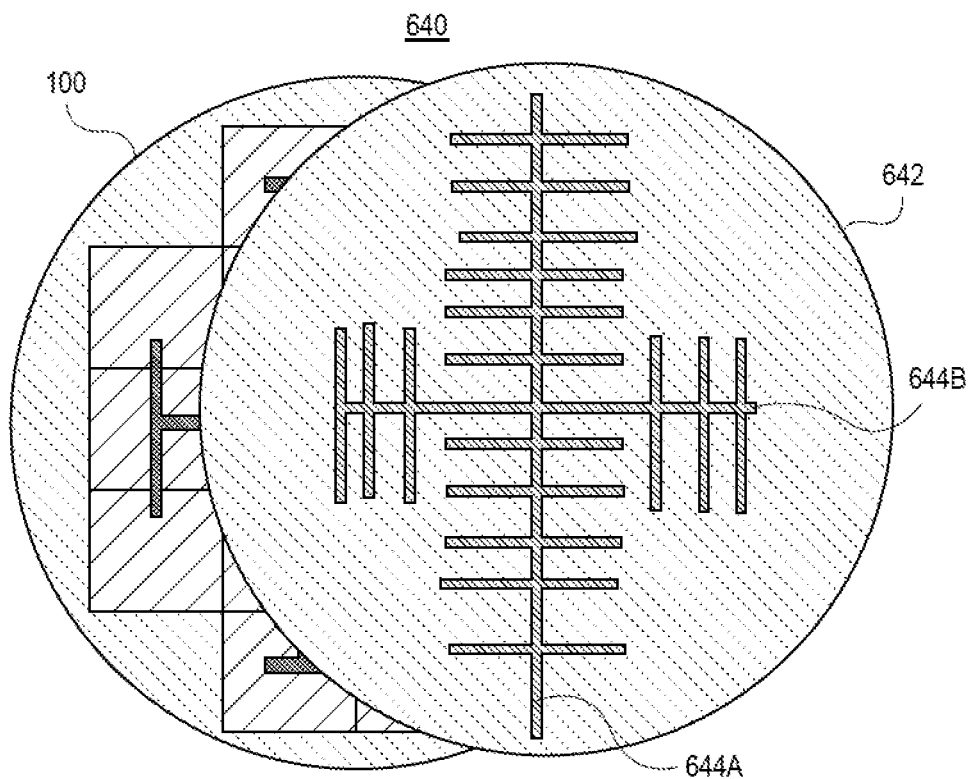
FIG. 6C illustrates a skewed plan view of a stitched die structure coupled to a substrate including microfluidic channels, in accordance with an embodiment of the present disclosure.
Figure 6D:
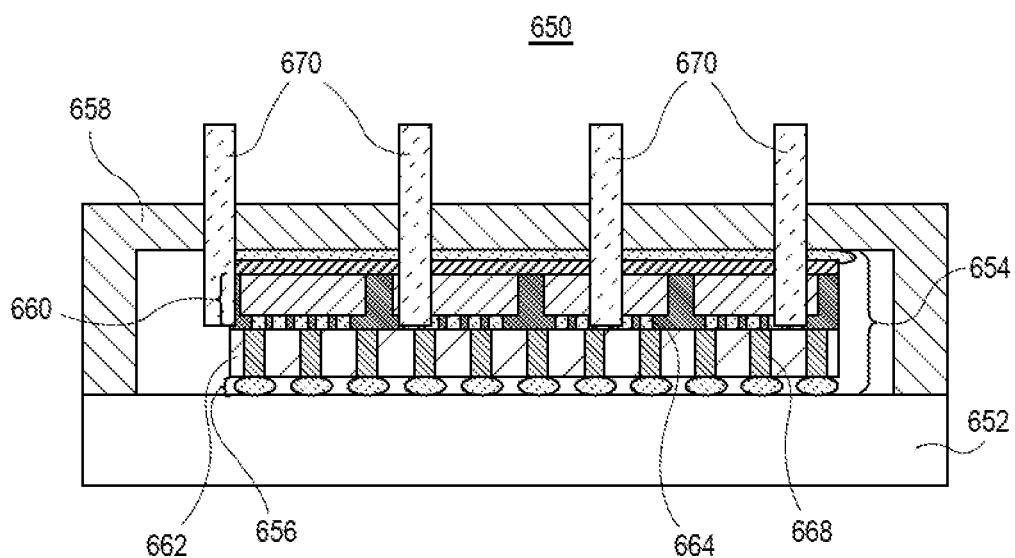
FIG. 6D illustrates a cross-sectional view of a stitched die structure coupled to microfluidic channels, in accordance with an embodiment of the present disclosure.

As second exemplary structures including a common cooling solution, FIG. 6C illustrates a skewed plan view of a stitched die structure coupled to a substrate including microfluidic channels, in accordance with an embodiment of the present disclosure. FIG. 6D illustrates a cross-sectional view of a stitched die structure coupled to microfluidic channels, in accordance with an embodiment of the present disclosure. Cooling solutions of FIGS. 6A and 6B may be applicable to any of the structures of FIGS. 1-5.

Referring to FIG. 6C, an apparatus 640 includes a full wafer engine(s) architecture 100 including a plurality of dies within a wafer, such as a silicon wafer. In one embodiment, full wafer engine(s) architecture 100 is such as described in association with FIG. 1 (and/or any of FIGS. 2, 3, 4 and/or 5). The apparatus 640 also includes a second substrate 642, such as a second silicon wafer. In one embodiment, the second substrate 642 has microfluidic channels 644A/644B formed therein. In a specific embodiment, the microfluidic channels 644A/644B include horizontal channels 644B and vertical channels 644A, as is depicted. It is to be appreciated that, in an embodiment, the second substrate 642 is vertically aligned with the full wafer engine(s) architecture 100; however, the two are skewed in FIG. 6C for illustrative purposes.

Referring again to FIG. 6C, in an embodiment, microfluidic channels (or microfluidic stitching) are included in a separate wafer, as is depicted, which can be wafer-to-wafer bonded to the full wafer engine(s) architecture 100. In another embodiment, the microfluidic channels (or microfluidic stitching) are included in the full wafer engine(s) architecture 100 (e.g., as stitched on top of a fully processed wafer.

In yet another embodiment, microfluidic channels (or microfluidic stitching) are included in or incorporated into the stitched die structure through a heat sink layer and/or thermal interface material layer. As an exemplary structure, referring to FIG. 6D, an apparatus 650 includes a board or substrate 652. A stitched die assembly 654 is coupled to the board or substrate 652, e.g., by interconnects 656. A heat spreader 658 is over the stitched die assembly 654. The stitched die assembly 654 includes a stitched die structure 660 coupled to an interposer 662, e.g., by interconnects 664. The interposer 662 can include through-interposer via structures or via bars 668, e.g., for coupling the interconnects 664 to the interconnects 656. The heat spreader 658 can be used to remove heat generated by or at the stitched die structure 660. The heat spreader 658 can be coupled to the stitched die structure 660 by a solder or other thermal interface material. In an embodiment, microfluidic channels 670 are formed through heat spreader 658, a thermal interface material (if included), and into the stitched die structure 660. In an embodiment, the microfluidic channels 670 provide direct liquid cooling of the stitched die structure 660. In one embodiment, the microfluidic channels 670 are used in conjunction with the heat spreader 658 for cooling of the stitched die structure 660. In another embodiment, the microfluidic channels 670 are used independently from the heat spreader 658 for cooling of the stitched die structure 660.

With reference again to FIGS. 4, 6C and 6D, in accordance with an embodiment of the present disclosure, an integrated circuit structure includes a first die 404 including a first device layer 412 and a first plurality of metallization layers 414 over the first device layer 412. The integrated circuit structure also includes a second die 406 including a second device layer 418 and a second plurality of metallization layers 420 over the second device layer 418. The second die 404 is separated from the second die 406 by a scribe region 408. A common conductive interconnection 410 is coupling the first die 404 and the second die 406 at a first side of the first 404 and second 406 dies. A plurality of microfluidic channels is coupled to the first side of the first 404 and second 406 dies. In one embodiment the plurality of microfluidic channels 644A/644B are within a substrate 642 coupled to the first side of the first and second dies, e.g., as described in association with FIG. 6C. In one embodiment, the plurality of microfluidic channels 670 are within the first and second dies, e.g., as described in association with FIG. 6D.

With reference again to FIGS. 4, 6A, 6B, 6C and 6D, in an embodiment, the common conductive interconnection 410 is a signal line. In an embodiment, the common conductive interconnection 410 is a backside power rail. In an embodiment, device layer 412 is similar to device layer 418. In one such, embodiment, both devices layers 412 and 418 are SRAM device layers or logic device layers. In another embodiment, device layer 412 is different than device layer 418. In one such, embodiment, device layer 412 is an SRAM device layer, and device layer 418 is a logic device layer.

In another aspect, it is to be appreciated that structures described in association with FIGS. 1-4 and 6A-6D may include or may ultimately be coupled to an interposer (e.g., as an intervening structure to coupling to a board), such as an interposer described in association with FIG. 5. However, there may be situations where an interposer area exceeds a reticle field limit.

Figure 7:
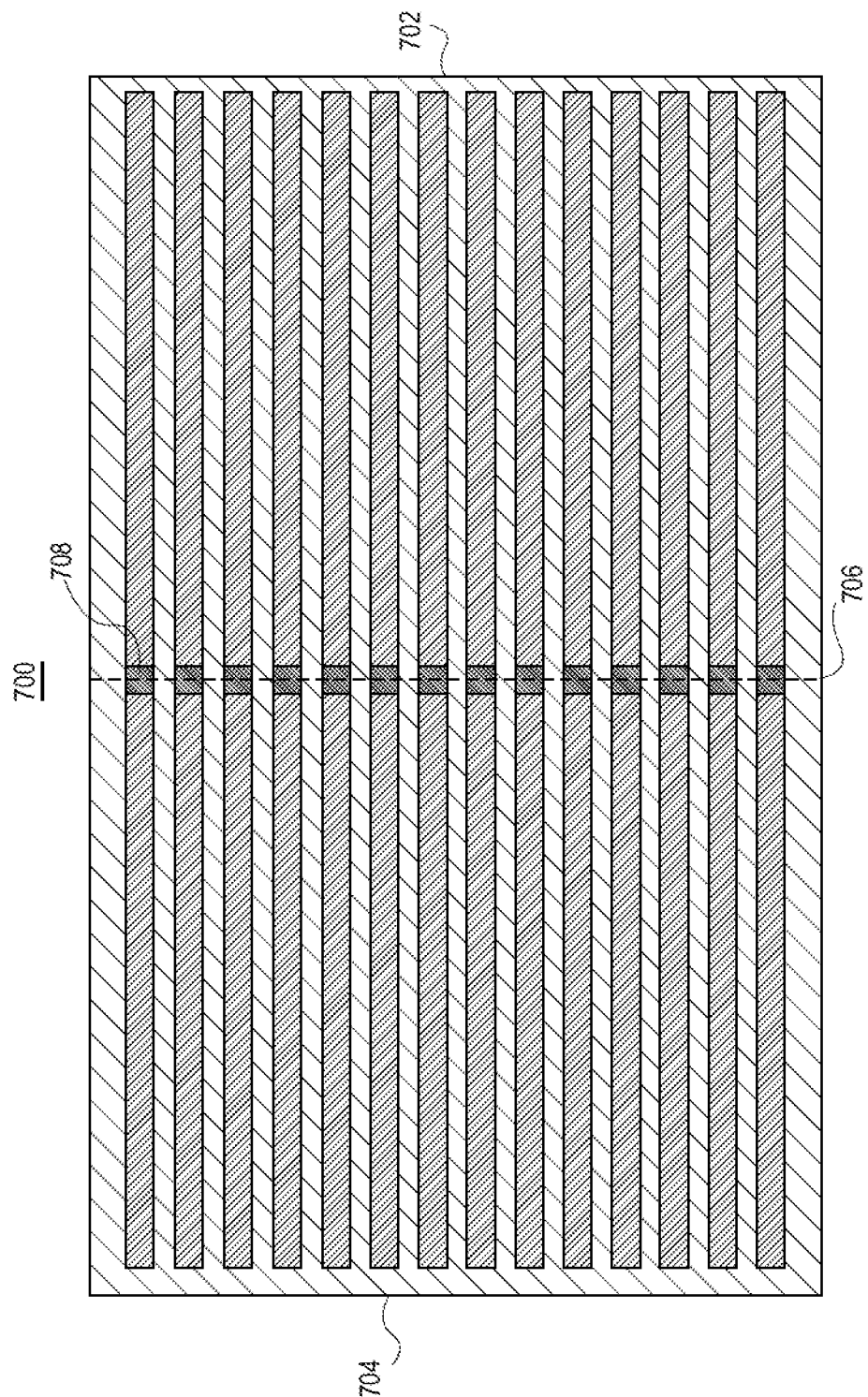
FIG. 7 is a plan view of a double expose connection for an interposer, in accordance with an embodiment of the present disclosure.

In a first example addressing the above issue, FIG. 7 is a plan view of a double expose connection for an interposer, in accordance with an embodiment of the present disclosure.

Referring to FIG. 7, an interposer structure 700 includes a first interposer portion 702 and a second interposer portion 704. The first interposer portion 702 and the second interposer portion 704 are coupled by connectors 708 (e.g., thick metal features) along an expose connection 706.

Figure 8:
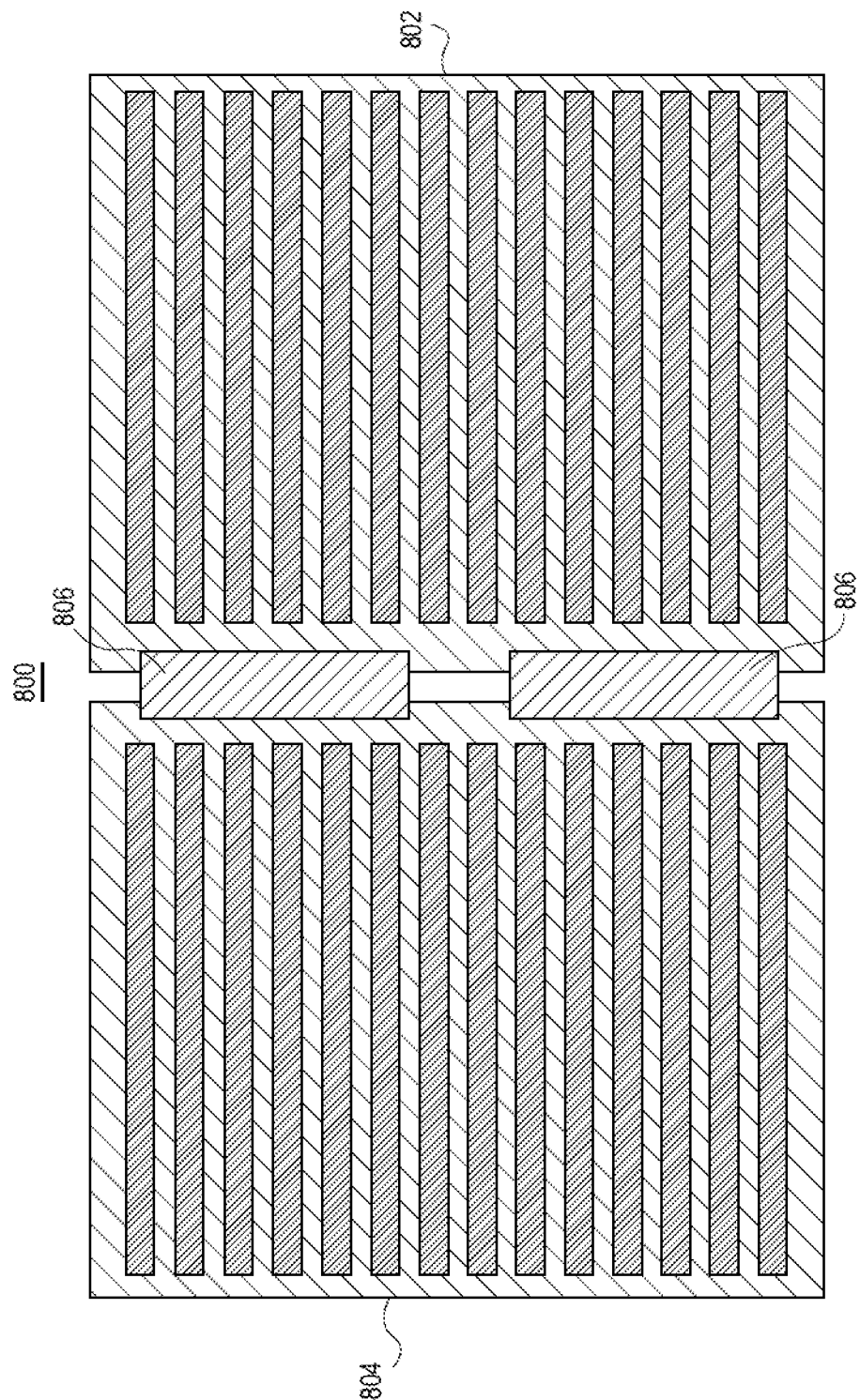
FIG. 8 is a plan view of a bridge connection for an interposer, in accordance with an embodiment of the present disclosure.

In a second example addressing the above issue, FIG. 8 is a plan view of a bridge connection for an interposer, in accordance with an embodiment of the present disclosure.

Referring to FIG. 8, an interposer structure 800 includes a first interposer portion 802 and a second interposer portion 804. The first interposer portion 802 and the second interposer portion 804 are coupled by one or more bridges 806 (which may be included in a package substrate), such as embedded bridges or open cavity bridges, examples of which are described in greater detail below. Thus, in an embodiment, an approach for interposer partitioning to enable miniaturization of small form factor and high performance is implemented for embodiments herein. Such architectures depend on fine die-to-die interconnects to couple the partitioned dies together. Embedded multi-die interconnect bridges (EMIBs) can be used to provide the fine die-to-die interconnects.

In another aspect, embodiments disclosed herein include an electronic package that includes an open cavity bridge, e.g., for interposer stitching or for die stitching. An open cavity bridge can include passive interconnections and, possibly, may include active regions with transistors or the like. As an example, FIG. 9 is a cross-sectional illustration representing an electronic package with an open cavity bridge, in accordance with an embodiment of the present disclosure.

Figure 9:
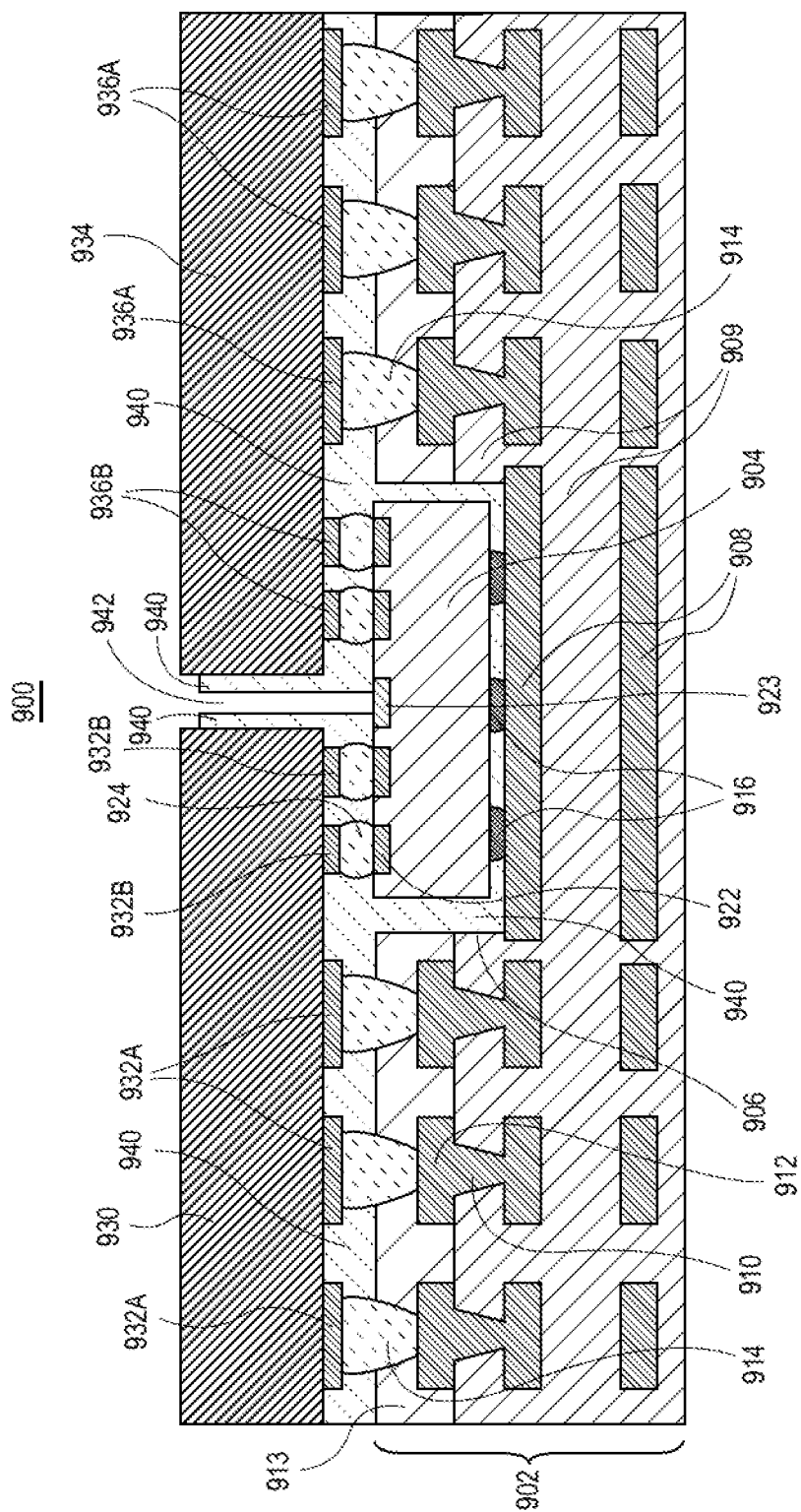
FIG. 9 is a cross-sectional illustration representing an electronic package with an open cavity bridge, in accordance with an embodiment of the present disclosure.

Referring to FIG. 9, an intermediate electronic apparatus 900 includes a package substrate 902 having alternating metallization layers 908 and dielectric layers 909. The package substrate 902 also includes a first plurality of substrate pads (left 912s) and a second plurality of substrate pads (right 912s), which may be coupled to the metallization layers 908 by conductive vias 910. An open cavity 906 is between the first plurality of substrate pads (left 912s) and the second plurality of substrate pads (right 912s). The open cavity 906 has a bottom and sides. A bridge die 904 is in the open cavity 906. The bridge die 904 includes a first plurality of bridge pads (left 922s), a second plurality of bridge pads (right 922s), a power delivery bridge pad 923 between the first plurality of bridge pads (left 922s) and the second plurality of bridge pads (right 922s), and conductive traces (not depicted). Solder structures 914 are coupled to the substrate pads 912, and may include a solder resist 913 there between. Solder structures 924 are coupled to the bridge pads 922. A first die 930 is coupled to the solder structures 914 on the first plurality of substrate pads (left 912s) and to the solder structures 924 on the first plurality of bridge pads (left 922s), e.g., by first die pads 932A and 932B, respectively. A second die 934 is coupled to the solder structures 914 on the second plurality of substrate pads (right 912s) and to the solder structures 924 on the second plurality of bridge pads (right 922s), e.g., by second die pads 936A and 936B, respectively. The second die 934 is coupled to the first die 930 by the conductive traces of the bridge die 904.

In an embodiment, intermediate electronic apparatus 900, further includes an underfill material 940 between the first die 930 and the package substrate 902, between the first die 930 and the bridge die 904, between the second die 934 and the package substrate 902, between the second die 934 and the bridge die 904, and in the open cavity 906. In an embodiment, a trench 942 is formed in the underfill material 940 between the first die 930 and the second die 934. In one embodiment, trench 942 is formed using a laser ablation or laser scribe process.

In an embodiment, epoxy dots 916 coupled bridge die 904 to the bottom of the open cavity 906 of package substrate 902. In one such embodiment, epoxy dots 916 are coupled to an exposed metallization layer 908 of package substrate 902, as is depicted. In other embodiments, epoxy dots 916 are coupled to a dielectric layer 909 of package substrate 902. In another embodiment, an adhesive layer couples the bridge die 904 to the bottom of the open cavity 906. In yet another embodiment, solder structures couple the bridge die 904 to the bottom of the open cavity 906. In one such embodiment, the bottom of the open cavity 906 has an exposed metal layer (e.g. one of metallization layers 908), the bridge die 904 has a first side including the first plurality of bridge pads (left 922s), the second plurality of bridge pads (right 922s), the power delivery bridge pad 923, and the conductive traces. The bridge die 904 has a second side including a metallization layer, and the solder structures are in contact with the metallization layer of the bridge die 904 and in contact with the exposed metal layer of the bottom of the open cavity 906.

In an embodiment, adjacent pads of the first plurality of bridge pads (left 922s) and adjacent pads of the second plurality of bridge pads (right 922s) have a first pitch, and adjacent pads of the first plurality of substrate pads (left 912s) and adjacent pads of the second plurality of substrate pads (right 912s) have a second pitch greater than the first pitch. In one embodiment, the first pitch is less than approximately 100 µm and the second pitch is greater than approximately 100 µm.

It is to be appreciated that a variety of possibilities exist for bridge die arrangements relative to the interconnected dies or interposer portions. As example, FIGS. 10A-10D are plan view illustrations of various electronic packages with an open cavity bridge, in accordance with another embodiment of the present disclosure.

Figure 10A:
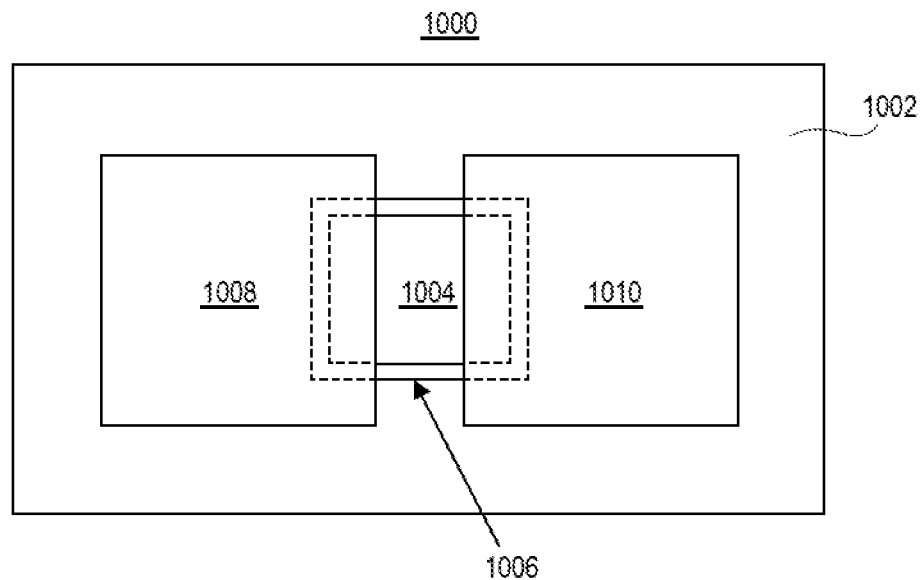
FIGS. 10A-10D are plan view illustrations of various electronic packages with an open cavity bridge, in accordance with another embodiment of the present disclosure.

Referring to FIG. 10A, an electronic package 1000 includes a package substrate 1002 having an open cavity 1006 therein. A bridge die 1004 is in the open cavity 1006. A first die 1008 and a second die 1010 are coupled together by the bridge die 1004. The first die 1008 and the second die 1010 have a linear arrangement with respect to the bridge die 1004.

Figure 10B:
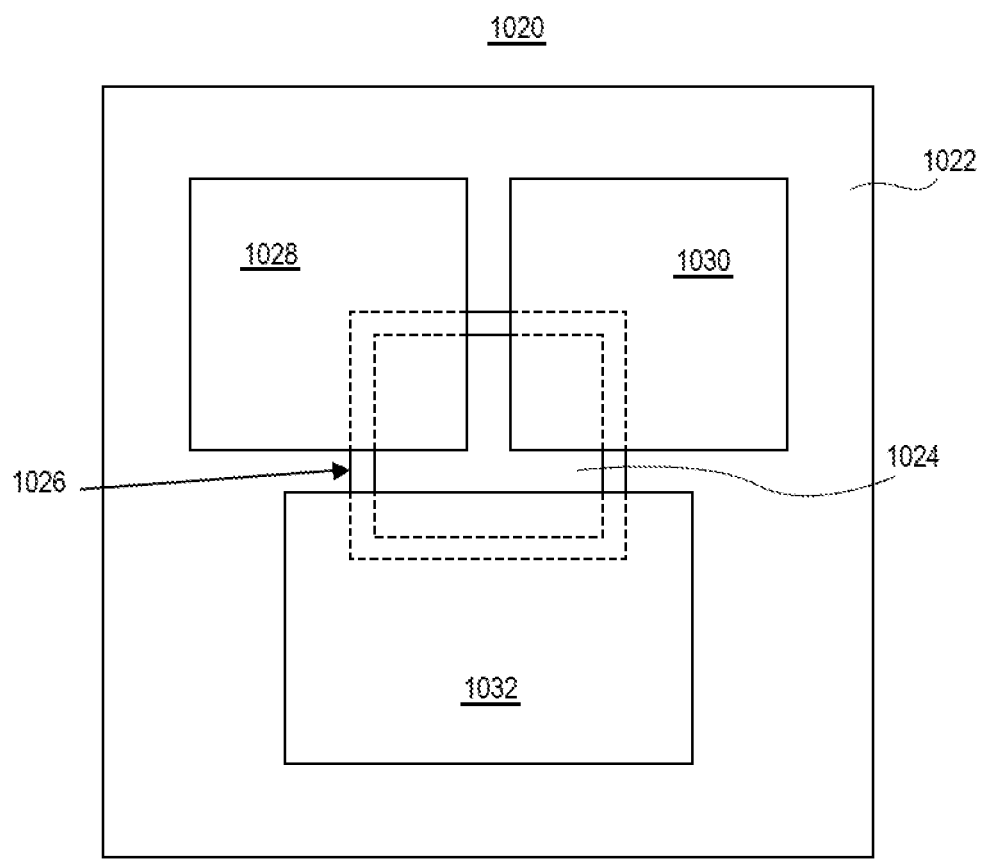

Referring to FIG. 10B, an electronic package 1020 includes a package substrate 1022 having an open cavity 1026 therein. A bridge die 1024 is in the open cavity 1026. A first die 1028, a second die 1030, and a third die 1032 are coupled together by the bridge die 1024.

Figure 10C:
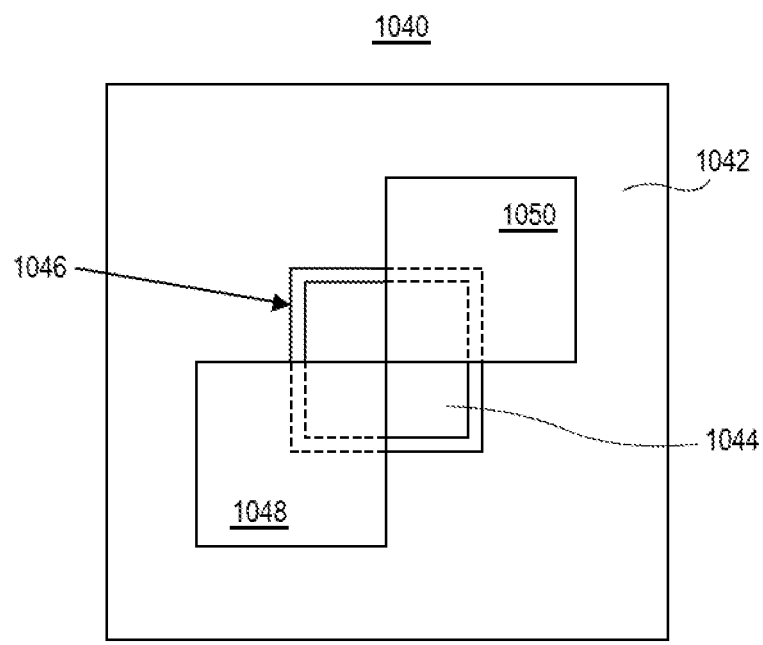

Referring to FIG. 10C, an electronic package 1040 includes a package substrate 1042 having an open cavity 1046 therein. A bridge die 1044 is in the open cavity 1046. A first die 1048 and a second die 1050 are coupled together by the bridge die 1044. The first die 1048 and the second die 1050 have a diagonal arrangement with respect to the bridge die 1044.

Figure 10D:
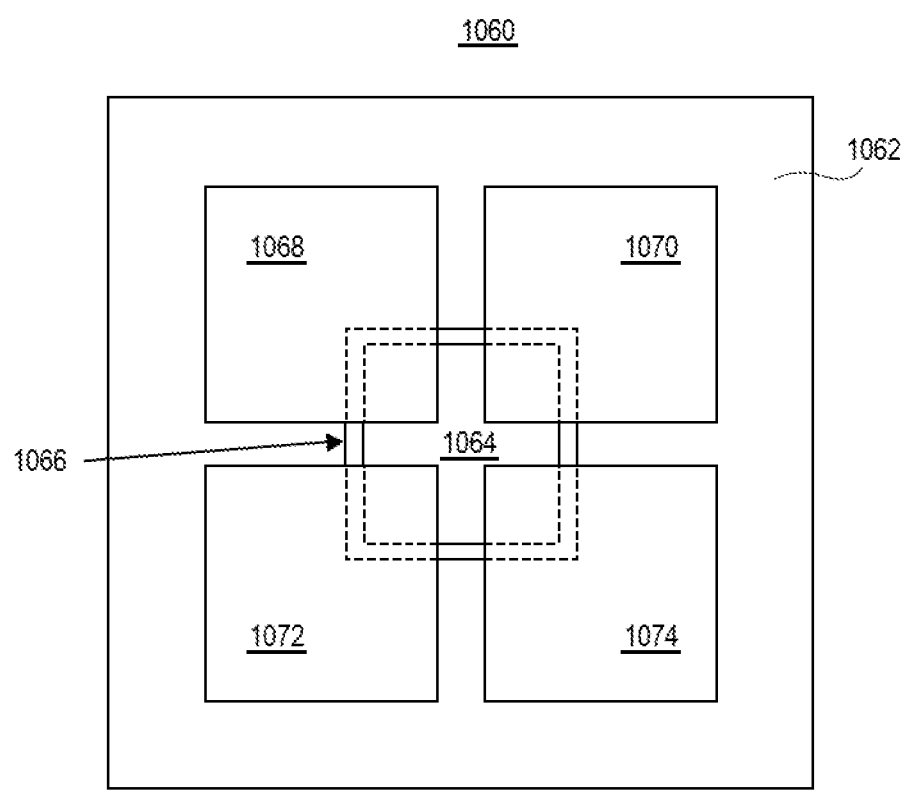

Referring to FIG. 10D, an electronic package 1060 includes a package substrate 1062 having an open cavity 1066 therein. A bridge die 1064 is in the open cavity 1066. A first die 1068, a second die 1070, a third die 1072, and a fourth die 1074 are coupled together by the bridge die 1064.

In an embodiment, a bridge die as described herein may include any suitable substrate material. In an embodiment, a bridge die as described herein is a silicon (Si) bridge die. In an embodiment, a bridge die as described herein includes glass, ceramic, semiconductor materials (e.g., high or low resistivity silicon, group III-V semiconductors, or the like), or organic substrates (high density interconnect (HDI) substrates, embedded trace substrates (ETS), high density package (HDP) substrates, molded substrates, or the like). In some embodiments, a bridge die is a passive device. That is, the bridge die may include only passive components (e.g., traces, vias, etc.). In other embodiments, the bridge die may be an active interposer. That is, the bridge die may include active devices (e.g., transistors etc.).

In an embodiment, a bridge die has an active surface. While referred to as an "active" surface, it is to be appreciated that the active surface may include entirely passive features. In an embodiment, the bridge die may include through component vias (TCVs). The TCVs may electrically couple the active surface to pads on the backside of the bridge die. In an embodiment, the bridge die has first level interconnects (FLIs) such as a copper bump, a solder, or any other suitable FLI interconnect architecture.

In an embodiment, a plurality of dies coupled by a bridge die may be any type of dies. For example, the dies may be processor dies, memory dies, graphics dies, or the like. In an embodiment, the dies may be embedded in a mold layer. An underfill layer may also partially embed the dies and surround interconnects below the dies, exemplary structures of which are described above.

It is to be appreciated that the integrated circuit structures described above can be subjected to backside reveal and/or co-integrated with backside revealed integrated circuit structures, e.g., for access by a backside power rail. As an example of a backside revealed device, FIG. 11 illustrate a cross-sectional view of a non-planar integrated circuit structure as taken along a gate line, in accordance with an embodiment of the present disclosure.

Figure 11:
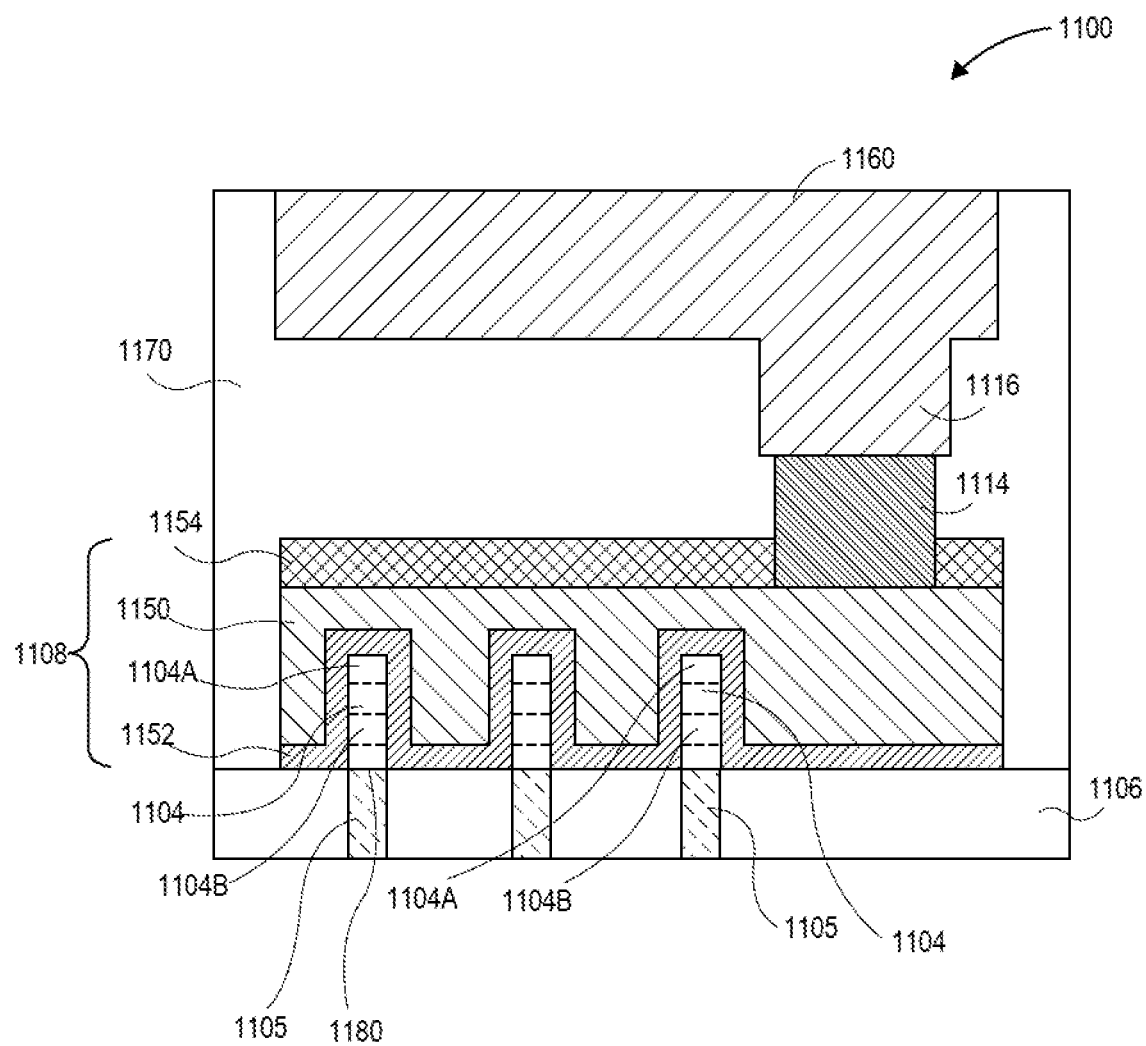
FIG. 11 illustrates a cross-sectional view of a non-planar integrated circuit structure as taken along a gate line, in accordance with an embodiment of the present disclosure.

Referring to FIG. 11, a semiconductor structure or device 1100 includes a non-planar active region (e.g., a solid fin structure including protruding fin portion 1104 and sub-fin region 1105) within a trench isolation region 1106. In another embodiment, instead of a solid fin, the non-planar active region is separated into nanowires (such as nanowires 1104A and 1104B) above sub-fin region 1105, as is represented by the dashed lines. In either case, for ease of description for non-planar integrated circuit structure 1100, a non-planar active region 1104 is referenced below as a protruding fin portion. It is to be appreciated that, in one embodiment, there is no bulk substrate coupled to the sub-fin region 1105.

A gate line 1108 is disposed over the protruding portions 1104 of the non-planar active region (including, if applicable, surrounding nanowires 1104A and 1104B), as well as over a portion of the trench isolation region 1106. As shown, gate line 1108 includes a gate electrode 1150 and a gate dielectric layer 1152. In one embodiment, gate line 1108 may also include a dielectric cap layer 1154. A gate contact 1114, and overlying gate contact via 1116 are also seen from this perspective, along with an overlying metal interconnect 1160, all of which are disposed in inter-layer dielectric stacks or layers 1170. Also seen from the perspective of FIG. 11, the gate contact 1114 is, in one embodiment, disposed over trench isolation region 1106, but not over the non-planar active regions.

In an embodiment, the semiconductor structure or device 1100 is a non-planar device such as, but not limited to, a fin-FET device, a tri-gate device, a nano-ribbon device, or a nanowire device. In such an embodiment, a corresponding semiconducting channel region is composed of or is formed in a three-dimensional body. In one such embodiment, the gate electrode stacks of gate lines 1108 surround at least a top surface and a pair of sidewalls of the three-dimensional body.

As is also depicted in FIG. 11, in an embodiment, an interface 1180 exists between a protruding fin portion 1104 and sub-fin region 1105. The interface 1180 can be a transition region between a doped sub-fin region 1105 and a lightly or undoped upper fin portion 1104. In one such embodiment, each fin is approximately 10 nanometers wide or less, and sub-fin dopants are supplied from an adjacent solid state doping layer at the sub-fin location. In a particular such embodiment, each fin is less than 10 nanometers wide. In another embodiment, the sub-fin region is a dielectric material, formed by recessing the fin through a wet or dry etch, and filling the recessed cavity with a conformal or flowable dielectric.

Although not depicted in FIG. 11, it is to be appreciated that source or drain regions of or adjacent to the protruding fin portions 1104 are on either side of the gate line 1108, i.e., into and out of the page. In one embodiment, the source or drain regions are doped portions of original material of the protruding fin portions 1104. In another embodiment, the material of the protruding fin portions 1104 is removed and replaced with another semiconductor material, e.g., by epitaxial deposition to form discrete epitaxial nubs or non-discrete epitaxial structures. In either embodiment, the source or drain regions may extend below the height of dielectric layer of trench isolation region 1106, i.e., into the sub-fin region 1105. In accordance with an embodiment of the present disclosure, the more heavily doped sub-fin regions, i.e., the doped portions of the fins below interface 1180, inhibits source to drain leakage through this portion of the bulk semiconductor fins.

With reference again to FIG. 11, in an embodiment, fins 1104/1105 (and, possibly nanowires 1104A and 1104B) are composed of a crystalline silicon, silicon/germanium or germanium layer doped with a charge carrier, such as but not limited to phosphorus, arsenic, boron or a combination thereof. In one embodiment, the concentration of silicon atoms is greater than 93%. In another embodiment, fins 1104/1105 are composed of a group III-V material, such as, but not limited to, gallium nitride, gallium phosphide, gallium arsenide, indium phosphide, indium antimonide, indium gallium arsenide, aluminum gallium arsenide, indium gallium phosphide, or a combination thereof. Trench isolation region 1106 may be composed of a dielectric material such as, but not limited to, silicon dioxide, silicon oxy-nitride, silicon nitride, or carbon-doped silicon nitride.

Gate line 1108 may be composed of a gate electrode stack which includes a gate dielectric layer 1152 and a gate electrode layer 1150. In an embodiment, the gate electrode of the gate electrode stack is composed of a metal gate and the gate dielectric layer is composed of a high-k material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of the substrate fin 1104. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride. In some implementations, a portion of the gate dielectric is a "U"-shaped structure that includes a bottom portion substantially parallel to the surface of the substrate and two sidewall portions that are substantially perpendicular to the top surface of the substrate.

In one embodiment, the gate electrode is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer. The gate electrode layer may consist of a P-type workfunction metal or an N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a conductive fill layer. For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV. In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

Spacers associated with the gate electrode stacks may be composed of a material suitable to ultimately electrically isolate, or contribute to the isolation of, a permanent gate structure from adjacent conductive contacts, such as self-aligned contacts. For example, in one embodiment, the spacers are composed of a dielectric material such as, but not limited to, silicon dioxide, silicon oxy-nitride, silicon nitride, or carbon-doped silicon nitride.

Gate contact 1114 and overlying gate contact via 1116 may be composed of a conductive material. In an embodiment, one or more of the contacts or vias are composed of a metal species. The metal species may be a pure metal, such as tungsten, nickel, or cobalt, or may be an alloy such as a metal-metal alloy or a metal-semiconductor alloy (e.g., such as a silicide material).

In an embodiment (although not shown), a contact pattern which is essentially perfectly aligned to an existing gate pattern 1108 is formed while eliminating the use of a lithographic step with exceedingly tight registration budget. In one such embodiment, the self-aligned approach enables the use of intrinsically highly selective wet etching (e.g., versus conventionally implemented dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in conventional approaches. In an embodiment, a trench contact grid is not separately patterned, but is rather formed between poly (gate) lines. For example, in one such embodiment, a trench contact grid is formed subsequent to gate grating patterning but prior to gate grating cuts.

In an embodiment, providing structure 1100 involves fabrication of the gate stack structure 1108 by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous NH$_4$OH or tetramethylammonium hydroxide. In one embodiment, dummy gates are composed of silicon nitride and are removed with a wet etch including aqueous phosphoric acid.

Referring again to FIG. 11, the arrangement of semiconductor structure or device 1100 places the gate contact over isolation regions. Such an arrangement may be viewed as inefficient use of layout space. In another embodiment, however, a semiconductor device has contact structures that contact portions of a gate electrode formed over an active region, e.g., over a sub-fin 1105, and in a same layer as a trench contact via.

It is to be appreciated that not all aspects of the processes described above need be practiced to fall within the spirit and scope of embodiments of the present disclosure. For example, in one embodiment, dummy gates need not ever be formed prior to fabricating gate contacts over active portions of the gate stacks. The gate stacks described above may actually be permanent gate stacks as initially formed. Also, the processes described herein may be used to fabricate one or a plurality of semiconductor devices. The semiconductor devices may be transistors or like devices. For example, in an embodiment, the semiconductor devices are a metal-oxide semiconductor (MOS) transistors for logic or memory, or are bipolar transistors. Also, in an embodiment, the semiconductor devices have a three-dimensional architecture, such as a trigate device, an independently accessed double gate device, a gate all around (GAA) device, a nanowire device, a nanoribbon device, or a FIN-FET. One or more embodiments may be particularly useful for fabricating semiconductor devices at a sub-10 nanometer (10 nm) technology node.

In an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide (SiO$_2$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In an embodiment, as is also used throughout the present description, metal lines or interconnect line material (and via material) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers (e.g., layers including one or more of Ta, TaN, Ti or TiN), stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a conductive material such as, but not limited to, Cu, Al, Ti, Zr, Hf, V, Ru, Co, Ni, Pd, Pt, W, Ag, Au or alloys thereof. The interconnect lines are also sometimes referred to in the art as traces, wires, lines, metal, or simply interconnect.

In an embodiment, as is also used throughout the present description, hardmask materials, capping layers, or plugs are composed of dielectric materials different from the interlayer dielectric material. In one embodiment, different hardmask, capping or plug materials may be used in different regions so as to provide different growth or etch selectivity to each other and to the underlying dielectric and metal layers. In some embodiments, a hardmask layer, capping or plug layer includes a layer of a nitride of silicon (e.g., silicon nitride) or a layer of an oxide of silicon, or both, or a combination thereof. Other suitable materials may include carbon-based materials. Other hardmask, capping or plug layers known in the arts may be used depending upon the particular implementation. The hardmask, capping or plug layers maybe formed by CVD, PVD, or by other deposition methods.

In an embodiment, as is also used throughout the present description, lithographic operations are performed using 193 nm immersion litho (i193), EUV and/or EBDW lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

In another aspect, integrated circuit structures described herein may be fabricated using a backside reveal of front side structures fabrication approach. In some exemplary embodiments, reveal of the backside of a transistor or other device structure entails wafer-level backside processing. In contrast to a conventional TSV-type technology, a reveal of the backside of a transistor as described herein may be performed at the density of the device cells, and even within sub-regions of a device. Furthermore, such a reveal of the backside of a transistor may be performed to remove substantially all of a donor substrate upon which a device layer was disposed during front side device processing. As such, a microns-deep TSV becomes unnecessary with the thickness of semiconductor in the device cells following a reveal of the backside of a transistor potentially being only tens or hundreds of nanometers.

Reveal techniques described herein may enable a paradigm shift from "bottom-up" device fabrication to "center-out" fabrication, where the "center" is any layer that is employed in front side fabrication, revealed from the backside, and again employed in backside fabrication. Processing of both a front side and revealed backside of a device structure may address many of the challenges associated with fabricating 3D ICs when primarily relying on front side processing.

A reveal of the backside of a transistor approach may be employed for example to remove at least a portion of a carrier layer and intervening layer of a donor-host substrate assembly, for example as illustrated in FIGS. 12A-12H and 13A-13H, described below. The process flow begins with an input of a donor-host substrate assembly. A thickness of a carrier layer in the donor-host substrate is polished (e.g., CMP) and/or etched with a wet or dry (e.g., plasma) etch process. Any grind, polish, and/or wet/dry etch process known to be suitable for the composition of the carrier layer may be employed. For example, where the carrier layer is a group IV semiconductor (e.g., silicon) a CMP slurry known to be suitable for thinning the semiconductor may be employed. Likewise, any wet etchant or plasma etch process known to be suitable for thinning the group IV semiconductor may also be employed.

In some embodiments, the above is preceded by cleaving the carrier layer along a fracture plane substantially parallel to the intervening layer. The cleaving or fracture process may be utilized to remove a substantial portion of the carrier layer as a bulk mass, reducing the polish or etch time needed to remove the carrier layer. For example, where a carrier layer is 400-900 µm in thickness, 100-700 µm may be cleaved off by practicing any blanket implant known to promote a wafer-level fracture. In some exemplary embodiments, a light element (e.g., H, He, or Li) is implanted to a uniform target depth within the carrier layer where the fracture plane is desired. Following such a cleaving process, the thickness of the carrier layer remaining in the donor-host substrate assembly may then be polished or etched to complete removal. Alternatively, where the carrier layer is not fractured, the grind, polish and/or etch operation may be employed to remove a greater thickness of the carrier layer.

Next, exposure of an intervening layer is detected. Detection is used to identify a point when the backside surface of the donor substrate has advanced to nearly the device layer. Any endpoint detection technique known to be suitable for detecting a transition between the materials employed for the carrier layer and the intervening layer may be practiced. In some embodiments, one or more endpoint criteria are based on detecting a change in optical absorbance or emission of the backside surface of the donor substrate during the polishing or etching performed. In some other embodiments, the endpoint criteria are associated with a change in optical absorbance or emission of byproducts during the polishing or etching of the donor substrate backside surface. For example, absorbance or emission wavelengths associated with the carrier layer etch byproducts may change as a function of the different compositions of the carrier layer and intervening layer. In other embodiments, the endpoint criteria are associated with a change in mass of species in byproducts of polishing or etching the backside surface of the donor substrate. For example, the byproducts of processing may be sampled through a quadrupole mass analyzer and a change in the species mass may be correlated to the different compositions of the carrier layer and intervening layer. In another exemplary embodiment, the endpoint criteria is associated with a change in friction between a backside surface of the donor substrate and a polishing surface in contact with the backside surface of the donor substrate.

Detection of the intervening layer may be enhanced where the removal process is selective to the carrier layer relative to the intervening layer as non-uniformity in the carrier removal process may be mitigated by an etch rate delta between the carrier layer and intervening layer. Detection may even be skipped if the grind, polish and/or etch operation removes the intervening layer at a rate sufficiently below the rate at which the carrier layer is removed. If an endpoint criteria is not employed, a grind, polish and/or etch operation of a predetermined fixed duration may stop on the intervening layer material if the thickness of the intervening layer is sufficient for the selectivity of the etch. In some examples, the carrier etch rate: intervening layer etch rate is 3:1-10:1, or more.

Upon exposing the intervening layer, at least a portion of the intervening layer may be removed. For example, one or more component layers of the intervening layer may be removed. A thickness of the intervening layer may be removed uniformly by a polish, for example. Alternatively, a thickness of the intervening layer may be removed with a masked or blanket etch process. The process may employ the same polish or etch process as that employed to thin the carrier, or may be a distinct process with distinct process parameters. For example, where the intervening layer provides an etch stop for the carrier removal process, the latter operation may employ a different polish or etch process that favors removal of the intervening layer over removal of the device layer. Where less than a few hundred nanometers of intervening layer thickness is to be removed, the removal process may be relatively slow, optimized for across-wafer uniformity, and more precisely controlled than that employed for removal of the carrier layer. A CMP process employed may, for example employ a slurry that offers very high selectively (e.g., 100:1-300:1, or more) between semiconductor (e.g., silicon) and dielectric material (e.g., SiO) surrounding the device layer and embedded within the intervening layer, for example, as electrical isolation between adjacent device regions.

For embodiments where the device layer is revealed through complete removal of the intervening layer, backside processing may commence on an exposed backside of the device layer or specific device regions there in. In some embodiments, the backside device layer processing includes a further polish or wet/dry etch through a thickness of the device layer disposed between the intervening layer and a device region previously fabricated in the device layer, such as a source or drain region.

In some embodiments where the carrier layer, intervening layer, or device layer backside is recessed with a wet and/or plasma etch, such an etch may be a patterned etch or a materially selective etch that imparts significant non-planarity or topography into the device layer backside surface. As described further below, the patterning may be within a device cell (i.e., "intra-cell" patterning) or may be across device cells (i.e., "inter-cell" patterning). In some patterned etch embodiments, at least a partial thickness of the intervening layer is employed as a hard mask for backside device layer patterning. Hence, a masked etch process may preface a correspondingly masked device layer etch.

The above described processing scheme may result in a donor-host substrate assembly that includes IC devices that have a backside of an intervening layer, a backside of the device layer, and/or backside of one or more semiconductor regions within the device layer, and/or front side metallization revealed. Additional backside processing of any of these revealed regions may then be performed during downstream processing.

In accordance with one or more embodiments of the present disclosure, in order to enable backside access to a partitioned source or drain contact structure, a double-sided device processing scheme may be practiced at the wafer-level. In some exemplary embodiments, a large formal substrate (e.g., 300 or 450 mm diameter) wafer may be processed. In an exemplary processing scheme, a donor substrate including a device layer is provided. In some embodiments, the device layer is a semiconductor material that is employed by an IC device. As one example, in a transistor device, such as a field effect transistor (FET), the channel semiconductor is formed from the semiconductor device layer. As another example, for an optical device, such as a photodiode, the drift and/or gain semiconductor is formed from the device layer. The device layer may also be employed in a passive structure with an IC device. For example, an optical waveguide may employ semiconductor patterned from the device layer.

In some embodiments, the donor substrate includes a stack of material layers. Such a material stack may facilitate subsequent formation of an IC device stratum that includes the device layer but lacks other layers of the donor substrate. In an exemplary embodiment, the donor substrate includes a carrier layer separated from the device layer by one or more intervening material layers. The carrier layer is to provide mechanical support during front side processing of the device layer. The carrier may also provide the basis for crystallinity in the semiconductor device layer. The intervening layer(s) may facilitate removal of the carrier layer and/or the reveal of the device layer backside.

Front side fabrication operations are then performed to form a device structure that includes one or more regions in the device layer. Any known front side processing techniques may be employed to form any known IC device and exemplary embodiments are further described elsewhere herein. A front side of the donor substrate is then joined to a host substrate to form a device-host assembly. The host substrate is to provide front side mechanical support during backside processing of the device layer. The host substrate may also entail integrated circuitry with which the IC devices fabricated on the donor substrate are interconnected. For such embodiments, joining of the host and donor substrate may further entail formation of 3D interconnect structures through hybrid (dielectric/metal) bonding. Any known host substrate and wafer-level joining techniques may be employed.

The process flow continues where the backside of the device stratum is revealed by removing at least a portion of the carrier layer. In some further embodiments, portions of any intervening layer and/or front side materials deposited over the device layer may also be removed during the reveal operation. As described elsewhere herein in the context of some exemplary embodiments, an intervening layer(s) may facilitate a highly-uniform exposure of the device stratum backside, for example serving as one or more of an etch marker or etch stop employed in the wafer-level backside reveal process. Device stratum surfaces exposed from the backside are processed to form a double-side device stratum. Native materials, such as any of those of the donor substrate, which interfaced with the device regions may then be replaced with one or more non-native materials. For example, a portion of a semiconductor device layer or intervening layer may be replaced with one or more other semiconductor, metal, or dielectric materials. In some further embodiments, portions of the front side materials removed during the reveal operation may also be replaced. For example, a portion of a dielectric spacer, gate stack, or contact metallization formed during front side device fabrication may be replaced with one or more other semiconductor, metal, or dielectric materials during backside deprocessing/reprocessing of the front side device. In still other embodiments, a second device stratum or metal interposer is bonded to the reveal backside.

The above process flow provides a device stratum-host substrate assembly. The device stratum-host assembly may then be further processed. For example, any known technique may be employed to singulate and package the device stratum-host substrate assembly. Where the host substrate is entirely sacrificial, packaging of the device stratum-host substrate may entail separation of the host substrate from the device stratum. Where the host substrate is not entirely sacrificial (e.g., where the host substrate also includes a device stratum), the device stratum-host assembly output may be fed back as a host substrate input during a subsequent iteration of the above process flow. Iteration of the above approach may thus form a wafer-level assembly of any number of double-side device strata, each only tens or hundreds of nanometers in thickness, for example. In some embodiments, and as further described elsewhere herein, one or more device cells within a device stratum are electrically tested, for example as a yield control point in the fabrication of a wafer-level assembly of double-side device strata. In some embodiments, the electrical test entails backside device probing.

FIGS. 12A-12H illustrate plan views of a substrate processed with double-sided device processing methods, in accordance with some embodiments. FIGS. 13A-13H illustrate cross-sectional views of a substrate processed with double-sided device processing methods, in accordance with some embodiments.

As shown in FIGS. 12A and 13A, donor substrate 1201 includes a plurality of IC die 1211 in an arbitrary spatial layout over a front side wafer surface. Front side processing of IC die 1211 may have been performed following any techniques to form any device structures. In exemplary embodiments, die 1211 include one or more semiconductor regions within device layer 1215. An intervening layer 1210 separates device layer 1215 from carrier layer 1205. In the exemplary embodiment, intervening layer 1210 is in direct contact with both carrier layer 1205 and device layer 1215. Alternatively, one or more spacer layers may be disposed between intervening layer 1210 and device layer 1215 and/or carrier layer 1205. Donor substrate 1201 may further include other layers, for example disposed over device layer 1215 and/or below carrier layer 1205.

Device layer 1215 may include one or more layers of any device material composition known to be suitable for a particular IC device, such as, but not limited to, transistors, diodes, and resistors. In some exemplary embodiments, device layer 1215 includes one or more group IV (i.e., IUPAC group 14) semiconductor material layers (e.g., Si, Ge, SiGe), group III-V semiconductor material layers (e.g., GaAs, InGaAs, InAs, InP), or group III-N semiconductor material layers (e.g., GaN, AlGaN, InGaN). Device layer 1215 may also include one or more semiconductor transition metal dichalcogenide (TMD or TMDC) layers. In other embodiments, device layer 1215 includes one or more graphene layer, or a graphenic material layer having semiconductor properties. In still other embodiments, device layer 1215 includes one or more oxide semiconductor layers. Exemplary oxide semiconductors include oxides of a transition metal (e.g., IUPAC group 4-10) or post-transition metal (e.g., IUPAC groups 11-14). In advantageous embodiments, the oxide semiconductor includes at least one of Cu, Zn, Sn, Ti, Ni, Ga, In, Sr, Cr, Co, V, or Mo. The metal oxides may be suboxides ($A_2O$) monoxides (AO), binary oxides ($AO_2$), ternary oxides ($ABO_3$), and mixtures thereof. In other embodiments, device layer 1215 includes one or more magnetic, ferromagnetic, ferroelectric material layer. For example device layer 1215 may include one or more layers of any material known to be suitable for an tunneling junction device, such as, but not limited to a magnetic tunneling junction (MTJ) device.

In some embodiments, device layer 1215 is substantially monocrystalline. Although monocrystalline, a significant number of crystalline defects may nonetheless be present. In other embodiments, device layer 1215 is amorphous or nanocrystalline. Device layer 1215 may be any thickness (e.g., z-dimension in FIG. 13A). In some exemplary embodiments, device layer 1215 has a thickness greater than a z-thickness of at least some of the semiconductor regions employed by die 1211 as functional semiconductor regions of die 1211 built on and/or embedded within device layer 1215 need not extend through the entire thickness of device layer 1215. In some embodiments, semiconductor regions of die 1211 are disposed only within a top-side thickness of device layer 1215 demarked in FIG. 13A by dashed line 1212. For example, semiconductor regions of die 1211 may have a z-thickness of 200-300 nm, or less, while device layer may have a z-thickness of 700-1000 nm, or more. As such, around 600 nm of device layer thickness may separate semiconductor regions of die 1211 from intervening layer 1210.

Carrier layer 1205 may have the same material composition as device layer 1215, or may have a material composition different than device layer 1215. For embodiments where carrier layer 1205 and device layer 1215 have the same composition, the two layers may be identified by their position relative to intervening layer 1210. In some embodiments where device layer 1215 is a crystalline group IV, group III-V or group III-N semiconductor, carrier layer 1205 is the same crystalline group IV, group III-V or group III-N semiconductor as device layer 1215. In alternative embodiments, where device layer 1215 is a crystalline group IV, group III-V or group III-N semiconductor, carrier layer 1205 is a different crystalline group IV, group III-V or group III-N semiconductor than device layer 1215. In still other embodiments, carrier layer 1205 may include, or be, a material onto which device layer 1215 transferred, or grown upon. For example, carrier layer may include one or more amorphous oxide layers (e.g., glass) or crystalline oxide layer (e.g., sapphire), polymer sheets, or any material(s) built up or laminated into a structural support known to be suitable as a carrier during IC device processing. Carrier layer 1205 may be any thickness (e.g., z-dimension in FIG. 13A) as a function of the carrier material properties and the substrate diameter. For example, where the carrier layer 1205 is a large format (e.g., 300-450 mm) semiconductor substrate, the carrier layer thickness may be 700-1000 m, or more.

In some embodiments, one or more intervening layers 1210 are disposed between carrier layer 1205 and device layer 1215. In some exemplary embodiments, an intervening layer 1210 is compositionally distinct from carrier layer 1205 such that it may serve as a marker detectable during subsequent removal of carrier layer 1205. In some such embodiments, an intervening layer 1210 has a composition that, when exposed to an etchant of carrier layer 1205 will etch at a significantly slower rate than carrier layer 1205 (i.e., intervening layer 1210 functions as an etch stop for a carrier layer etch process). In further embodiments, intervening layer 1210 has a composition distinct from that of device layer 1215. Intervening layer 1210 may be a metal, semiconductor, or dielectric material, for example.

In some exemplary embodiments where at least one of carrier layer 1205 and device layer 1215 are crystalline semiconductors, intervening layer 1210 is also a crystalline semiconductor layer. Intervening layer 1210 may further have the same crystallinity and crystallographic orientation as carrier layer 1205 and/or device layer 1215. Such embodiments may have the advantage of reduced donor substrate cost relative to alternative embodiments where intervening layer 1210 is a material that necessitates bonding (e.g., thermal-compression bonding) of intervening layer 1210 to intervening layer 1210 and/or to carrier layer 1205.

For embodiments where intervening layer 1210 is a semiconductor, one or more of the primary semiconductor lattice elements, alloy constituents, or impurity concentrations may vary between at least carrier layer 1205 and intervening layer 1210. In some embodiments where at least carrier layer 1205 is a group IV semiconductor, intervening layer 1210 may also be a group IV semiconductor, but of a different group IV element or alloy and/or doped with an impurity species to an impurity level different than that of carrier layer 1205. For example, intervening layer 1210 may be a silicon-germanium alloy epitaxially grown on a silicon carrier. For such embodiments, a pseudomorphic intervening layer may be grown heteroepitaxially to any thickness below the critical thickness. Alternatively, the intervening layer 1210 may be a relaxed buffer layer having a thickness greater than the critical thickness.

In other embodiments, where at least carrier layer 1205 is a group III-V semiconductor, intervening layer 1210 may also be a group III-V semiconductor, but of a different group III-V alloy and/or doped with an impurity species to an impurity level different than that of carrier layer 1205. For example, intervening layer 1210 may be an AlGaAs alloy epitaxially grown on a GaAs carrier. In some other embodiments where both carrier layer 1205 and device layer 1215 are crystalline semiconductors, intervening layer 1210 is also a crystalline semiconductor layer, which may further have the same crystallinity and crystallographic orientation as carrier layer 1205 and/or device layer 1215.

In embodiments where both carrier layer 1205 and intervening layer 1210 are of the same or different primary semiconductor lattice elements, impurity dopants may differentiate the carrier and intervening layer. For example, intervening layer 1210 and carrier layer 1205 may both be silicon crystals with intervening layer 1210 lacking an impurity present in carrier layer 1205, or doped with an impurity absent from carrier layer 1205, or doped to a different level with an impurity present in carrier layer 1205. The impurity differentiation may impart etch selectivity between the carrier and intervening layer, or merely introduce a detectable species.

Intervening layer 1210 may be doped with impurities that are electrically active (i.e., rendering it an n-type or p-type semiconductor), or not, as the impurity may provide any basis for detection of the intervening layer 1210 during subsequent carrier removal. Exemplary electrically active impurities for some semiconductor materials include group III elements (e.g., B), group IV elements (e.g., P). Any other element may be employed as a non-electrically active species. Impurity dopant concentration within intervening layer 1210 need only vary from that of carrier layer 1205 by an amount sufficient for detection, which may be predetermined as a function of the detection technique and detector sensitivity.

As described further elsewhere herein, intervening layer 1210 may have a composition distinct from device layer 1215. In some such embodiments, intervening layer 1210 may have a different band gap than that of device layer 1215. For example, intervening layer 1210 may have a wider band-gap than device layer 1215.

In embodiments where intervening layer 1210 includes a dielectric material, the dielectric material may be an inorganic material (e.g., SiO, SiN, SiON, SiOC, hydrogen silsesquioxane, methyl silsesquioxane) or organic material (polyimide, polynorbornenes, benzocyclobutene). For some dielectric embodiments, intervening layer 1210 may be formed as an embedded layer (e.g., SiOx through implantation of oxygen into a silicon device and/or carrier layer). Other embodiments of a dielectric intervening layer may necessitate bonding (e.g., thermal-compression bonding) of carrier layer 1205 to device layer 1215. For example, where donor substrate 1201 is a semiconductor-on-oxide (SOI) substrate, either or both of carrier layer 1205 and device layer 1215 may be oxidized and bonded together to form a SiO intervening layer 1210. Similar bonding techniques may be employed for other inorganic or organic dielectric materials.

In some other embodiments, intervening layer 1210 includes two or more materials laterally spaced apart within the layer. The two or more materials may include a dielectric and a semiconductor, a dielectric and a metal, a semiconductor and a metal, a dielectric and a metal, two different dielectric, two different semiconductors, or two different metals. Within such an intervening layer, a first material may surround islands of the second material that extend through the thickness of the intervening layer. For example, an intervening layer may include a field isolation dielectric that surrounds islands of semiconductor, which extend through the thickness of the intervening layer. The semiconductor may be epitaxially grown within openings of a patterned dielectric or the dielectric material may be deposited within openings of a patterned semiconductor.

In some exemplary embodiments, semiconductor features, such as fins or mesas, are etched into a front side surface of a semiconductor device layer. Trenches surrounding these features may be subsequently backfilled with an isolation dielectric, for example following any known shallow trench isolation (STI) process. One or more of the semiconductor feature or isolation dielectric may be employed for terminating a backside carrier removal process, for example as a backside reveal etch stop. In some embodiments, a reveal of trench isolation dielectric may stop, significantly retard, or induce a detectable signal for terminating a backside carrier polish. For example, a CMP polish of carrier semiconductor employing a slurry that has high selectivity favoring removal of carrier semiconductor (e.g., Si) over removal of isolation dielectric (e.g., SiO) may be significantly slowed upon exposure of a (bottom) surface of the trench isolation dielectric surrounding semiconductor features including the device layer. Because the device layer is disposed on a front side of intervening layer, the device layer need not be directly exposed to the backside reveal process.

Notably, for embodiments where the intervening layer includes both semiconductor and dielectric, the intervening layer thickness may be considerably greater than the critical thickness associated with the lattice mismatch of the intervening layer and carrier. Whereas an intervening layer below critical thickness may be an insufficient thickness to accommodate non-uniformity of a wafer-level backside reveal process, embodiments with greater thickness may advantageously increase the backside reveal process window. Embodiments with pin-holed dielectric may otherwise facilitate subsequent separation of carrier and device layers as well as improve crystal quality within the device layer.

Semiconductor material within intervening layers that include both semiconductor and dielectric may also be homoepitaxial. In some exemplary embodiments, a silicon epitaxial device layer is grown through a pin-holed dielectric disposed over a silicon carrier layer.

Continuing with description of FIGS. 12A and 13A, intervening layer 1210 may also be a metal. For such embodiments, the metal may be of any composition known to be suitable for bonding to carrier layer 1205 or device layer 1215. For example, either or both of carrier layer 1205 and device layer 1215 may be finished with a metal, such as, but not limited to Au or Pt, and subsequently bonded together, for example to form an Au or Pt intervening layer 1210. Such a metal may also be part of an intervening layer that further includes a patterned dielectric surrounding metal features.

Intervening layer 1210 may be of any thickness (e.g., z-height in FIG. 13A). The intervening layer should be sufficiently thick to ensure the carrier removal operation can be reliably terminated before exposing device regions and/or device layer 1215. Exemplary thicknesses for intervening layer 1210 range from a few hundred nanometers to a few micrometers and may vary as a function of the amount of carrier material that is to be removed, the uniformity of the carrier removal process, and the selectivity of the carrier removal process, for example. For embodiments where the intervening layer has the same crystallinity and crystallographic orientation as carrier layer 1205, the carrier layer thickness may be reduced by the thickness of intervening layer 1210. In other words, intervening layer 1210 may be a top portion of a 700-1000 μm thick group IV crystalline semiconductor substrate also employed as the carrier layer. In pseudomorphic heteroepitaxial embodiments, intervening layer thickness may be limited to the critical thickness. For heteroepitaxial intervening layer embodiments employing aspect ratio trapping (ART) or another fully relaxed buffer architecture, the intervening layer may have any thickness.

As further illustrated in FIGS. 12B and 13B, donor substrate 1201 may be joined to a host substrate 1202 to form a donor-host substrate assembly 1203. In some exemplary embodiments, a front side surface of donor substrate 1201 is joined to a surface of host substrate 1202 such that device layer 1215 is proximal host substrate 1202 and carrier layer 1205 is distal from host substrate 1202. Host substrate 1202 may be any substrate known to be suitable for joining to device layer 1215 and/or a front side stack fabricated over device layer 1215. In some embodiments, host substrate 1202 includes one or more additional device strata. For example, host substrate 1202 may further include one or more device layer (not depicted). Host substrate 1202 may include integrated circuitry with which the IC devices fabricated in a device layer of host substrate 1202 are interconnected, in which case joining of device layer 1215 to host substrate 1202 may further entail formation of 3D interconnect structures through the wafer-level bond.

Although not depicted in detail by FIG. 13B, any number of front side layers, such as interconnect metallization levels and interlayer dielectric (ILD) layers, may be present between device layer 1215 and host substrate 1202. Any technique may be employed to join host substrate 1202 and donor substrate 1201. In some exemplary embodiments further described elsewhere herein, the joining of donor substrate 1201 to host substrate 1202 is through metal-metal, oxide-oxide, or hybrid (metal/oxide-metal/oxide) thermal compression bonding.

With host substrate 1202 facing device layer 1215 on a side opposite carrier layer 1205, at least a portion of carrier layer 1205 may be removed as further illustrated in FIGS. 12C and 13C. Where the entire carrier layer 1205 is removed, donor-host substrate assembly 1203 maintains a highly uniform thickness with planar backside and front side surfaces. Alternatively, carrier layer 1205 may be masked and intervening layer 1210 exposed only in unmasked sub-regions to form a non-planar backside surface. In the exemplary embodiments illustrated by FIGS. 12C and 13C, carrier layer 1205 is removed from the entire backside surface of donor-host substrate assembly 1203. Carrier layer 1205 may be removed, for example by cleaving, grinding, and/or polishing (e.g., chemical-mechanical polishing), and/or wet chemical etching, and/or plasma etching through a thickness of the carrier layer to expose intervening layer 1210. One or more operations may be employed to remove carrier layer 1205. Advantageously, the removal operation(s) may be terminated based on duration or an endpoint signal sensitive to exposure of intervening layer 1210.

In further embodiments, for example as illustrated by FIGS. 12D and 13D, intervening layer 1210 is also at least partially etched to expose a backside of device layer 1215.

At least a portion of intervening layer 1210 may be removed subsequent to its use as a carrier layer etch stop and/or carrier layer etch endpoint trigger. Where the entire intervening layer 1210 is removed, donor-host substrate assembly 1203 maintains a highly uniform device layer thickness with planar backside and front side surfaces afforded by the intervening layer 1210 being much thinner than the carrier layer. Alternatively, intervening layer 1210 may be masked and device layer 1215 exposed only in unmasked sub-regions, thereby forming a non-planar backside surface. In the exemplary embodiments illustrated by FIGS. 12D and 13D, intervening layer 1210 is removed from the entire backside surface of donor-host substrate assembly 1203. Intervening layer 1210 may be so removed, for example, by polishing (e.g., chemical-mechanical polishing), and/or blanket wet chemical etching, and/or blanket plasma etching through a thickness of the intervening layer to expose device layer 1215. One or more operations may be employed to remove intervening layer 1210. Advantageously, the removal operation(s) may be terminated based on duration or an endpoint signal sensitive to exposure of device layer 1215.

In some further embodiments, for example as illustrated by FIGS. 12E and 13E, device layer 1215 is partially etched to expose a backside of a device structure previously formed from during front side processing. At least a portion of device layer 1215 may be removed subsequent to its use in fabricating one or more of the device semiconductor regions, and/or its use as an intervening layer etch stop or endpoint trigger. Where device layer 1215 is thinned over the entire substrate area, donor-host substrate assembly 1203 maintains a highly uniform reduced thickness with planar back and front surfaces. Alternatively, device layer 1215 may be masked and device structures (e.g., device semiconductor regions) selectively revealed only in unmasked sub-regions, thereby forming a non-planar backside surface. In the exemplary embodiments illustrated by FIGS. 12E and 13E, device layer 1215 is thinned over the entire backside surface of donor-host substrate assembly 1203. Device layer 1215 may be thinned, for example by polishing (e.g., chemical-mechanical polishing), and/or wet chemical etching, and/or plasma etching through a thickness of the device layer to expose one or more device semiconductor regions, and/or one or more other device structures (e.g., front side device terminal contact metallization, spacer dielectric, etc.) previously formed during front side processing. One or more operations may be employed to thin device layer 1215. Advantageously, the device layer thinning may be terminated based on duration or an endpoint signal sensitive to exposure of patterned features within device layer 1215. For example, where front side processing forms device isolation features (e.g., shallow trench isolation), backside thinning of device layer 1215 may be terminated upon exposing the isolation dielectric material.

A non-native material layer may be deposited over a backside surface of an intervening layer, device layer, and/or specific device regions within device layer 1215, and/or over or more other device structures (e.g., front side device terminal contact metallization, spacer dielectric, etc.). One or more materials exposed (revealed) from the backside may be covered with non-native material layer or replaced with such a material. In some embodiments, illustrated by FIGS. 12F and 13F, non-native material layer 1220 is deposited on device layer 1215. Non-native material layer 1220 may be any material having a composition and/or microstructure distinct from that of the material removed to reveal the backside of the device stratum. For example, where intervening layer 1210 is removed to expose device layer 1215, non-native material layer 1220 may be another semiconductor of different composition or microstructure than that of intervening layer 1210. In some such embodiments where device layer 1215 is a group III-N semiconductor, non-native material layer 1220 may also be a group III-N semiconductor of the same or different composition that is regrown upon a revealed backside surface of a group III-N device region. This material may be epitaxially regrown from the revealed group III-N device region, for example, to have better crystal quality than that of the material removed, and/or to induce strain within the device layer and/or device regions within the device layer, and/or to form a vertical (e.g., z-dimension) stack of device semiconductor regions suitable for a stacked device.

In some other embodiments where device layer 1215 is a group III-V semiconductor, non-native material layer 1220 may also be a group III-V semiconductor of the same or different composition that is regrown upon a revealed backside surface of a group III-V device region. This material may be epitaxially regrown from the revealed group III-V device region, for example, to have relatively better crystal quality than that of the material removed, and/or to induce strain within the device layer or a specific device region within the device layer, and/or to form a vertical stack of device semiconductor regions suitable for a stacked device.

In some other embodiments where device layer 1215 is a group IV semiconductor, non-native material layer 1220 may also be a group IV semiconductor of the same or different composition that is regrown upon a revealed backside surface of a group IV device region. This material may be epitaxially regrown from the revealed group IV device region, for example, to have relatively better crystal quality than that of the material removed, and/or to induce strain within the device region, and/or to form a stack of device semiconductor regions suitable for a stacked device.

In some other embodiments, non-native material layer 1220 is a dielectric material, such as, but not limited to SiO, SiON, SiOC, hydrogen silsesquioxane, methyl silsesquioxane, polyimide, polynorbornenes, benzocyclobutene, or the like. Deposition of such a dielectric may serve to electrically isolate various device structures, such as semiconductor device regions, that may have been previously formed during front side processing of donor substrate 1201.

In some other embodiments, non-native material layer 1220 is a conductive material, such as any elemental metal or metal alloy known to be suitable for contacting one or more surfaces of device regions revealed from the backside. In some embodiments, non-native material layer 1220 is a metallization suitable for contacting a device region revealed from the backside, such as a transistor source or drain region. In embodiments, intermetallic contacts such as $Ni_xSi_y$, $Ti_xSi_y$, Ni:Si:Pt, TiSi, CoSi, etc. may be formed. Additionally, implants may be used to enable robust contacts (e.g., P, Ge, B etc.).

In some embodiments, non-native material layer 1220 is a stack of materials, such as a FET gate stack that includes both a gate dielectric layer and a gate electrode layer. As one example, non-native material layer 1220 may be a gate dielectric stack suitable for contacting a semiconductor device region revealed from the backside, such as a transistor channel region. Any of the other the materials described as options for device layer 1215 may also be deposited over a backside of device layer 1215 and/or over device regions formed within device layer 1215. For example, non-native material layer 1220 may be any of the oxide semiconductors, TMDC, or tunneling materials described above, which may be deposited on the backside, for example, to incrementally fabricate vertically-stacked device strata.

Backside wafer-level processing may continue in any manner known to be suitable for front side processing. For example, non-native material layer 1220 may be patterned into active device regions, device isolation regions, device contact metallization, or device interconnects using any known lithographic and etch techniques. Backside wafer-level processing may further fabricate one or more interconnect metallization levels coupling terminals of different devices into an IC. In some embodiments further described elsewhere herein, backside processing may be employed to interconnect a power bus to various device terminals within an IC.

In some embodiments, backside processing includes bonding to a secondary host substrate. Such bonding may employ any layer transfer process to join the backside (e.g., non-native) material layer to another substrate. Following such joining, the former host substrate may be removed as a sacrificial donor to re-expose the front side stack and/or the front side of the device layer. Such embodiments may enable iterative side-to-side lamination of device strata with a first device layer serving as the core of the assembly. In some embodiments illustrated in FIGS. 12G and 13G, secondary host substrate 1240 joined to non-native material layer 1220 provides at least mechanical support while host substrate 1202 is removed.

Any bonding, such as, but not limited to, thermal-compression bonding may be employed to join secondary host substrate 1240 to non-native material layer 1220. In some embodiments, both a surface layer of secondary host substrate 1240 and non-native material layer 1220 are continuous dielectric layers (e.g., SiO), which are thermal-compression bonded. In some other embodiments, both a surface layer of secondary host substrate 1240 and non-native material layer 1220 include a metal layer (e.g., Au, Pt, etc.), which are thermal-compression bonded. In other embodiments, at least one of surface layer of secondary host substrate 1240 and non-native material layer 1220 are patterned, including both patterned metal surface (i.e., traces) and surrounding dielectric (e.g., isolation), which are thermal-compression bonded to form a hybrid (e.g., metal/oxide) joint. For such embodiments, structural features in the secondary host substrate 1240 and the patterned non-native material layer 1220 are aligned (e.g., optically) during the bonding process. In some embodiments, non-native material layer 1220 includes one or more conductive backside traces coupled to a terminal of a transistor fabricated in device layer 1215. The conductive backside trace may, for example, be bonded to metallization on secondary host substrate 1240.

Bonding of device strata may proceed from the front side and/or backside of a device layer before or after front side processing of the device layer has been completed. A backside bonding process may be performed after front side fabrication of a device (e.g., transistor) is substantially complete. Alternatively, backside bonding process may be performed prior to completing front side fabrication of a device (e.g., transistor), in which case the front side of the device layer may receive additional processing following the backside bonding process. As further illustrated in FIGS. 12H and 13H, for example, front side processing includes removal of host substrate 1202 (as a second donor substrate) to re-expose the front side of device layer 1215. At this point, donor-host substrate assembly 1203 includes secondary host 1240 joined to device layer 1215 through non-native material layer 1220.

It is to be appreciated that the integrated circuit structures described above can be co-integrated with other backside revealed integrated circuit structures such as nanowire or nanoribbon based devices. To highlight an exemplary integrated circuit structure having three vertically arranged nanowires, FIG. 14A illustrates a three-dimensional cross-sectional view of a nanowire-based integrated circuit structure, in accordance with an embodiment of the present disclosure. FIG. 14B illustrates a cross-sectional source or drain view of the nanowire-based integrated circuit structure of FIG. 14A, as taken along an a-a' axis. FIG. 14C illustrates a cross-sectional channel view of the nanowire-based integrated circuit structure of FIG. 14A, as taken along the b-b' axis.

Referring to FIG. 14A, an integrated circuit structure 1400 includes one or more vertically stacked nanowires (1404 set) above a substrate 1402. In an embodiment, as depicted, a local isolation structure 1402C, a growth enhancement layer 1402B, and a lower substrate portion 1402A are included in substrate 1402, as is depicted. An optional fin below the bottommost nanowire and formed from the substrate 1402 is not depicted for the sake of emphasizing the nanowire portion for illustrative purposes. Embodiments herein are targeted at both single wire devices and multiple wire devices. As an example, a three nanowire-based devices having nanowires 1404A, 1404B and 1404C is shown for illustrative purposes. For convenience of description, nanowire 1404A is used as an example where description is focused on one of the nanowires. It is to be appreciated that where attributes of one nanowire are described, embodiments based on a plurality of nanowires may have the same or essentially the same attributes for each of the nanowires.

Each of the nanowires 1404 includes a channel region 1406 in the nanowire. The channel region 1406 has a length (L). Referring to FIG. 14C, the channel region also has a perimeter (Pc) orthogonal to the length (L). Referring to both FIGS. 14A and 14C, a gate electrode stack 1408 surrounds the entire perimeter (Pc) of each of the channel regions 1406. The gate electrode stack 1408 includes a gate electrode along with a gate dielectric layer between the channel region 1406 and the gate electrode (not shown). In an embodiment, the channel region is discrete in that it is completely surrounded by the gate electrode stack 1408 without any intervening material such as underlying substrate material or overlying channel fabrication materials. Accordingly, in embodiments having a plurality of nanowires 1404, the channel regions 1406 of the nanowires are also discrete relative to one another.

Referring to both FIGS. 14A and 14B, integrated circuit structure 1400 includes a pair of non-discrete source or drain regions 1410/1412. The pair of non-discrete source or drain regions 1410/1412 is on either side of the channel regions 1406 of the plurality of vertically stacked nanowires 1404. Furthermore, the pair of non-discrete source or drain regions 1410/1412 is adjoining for the channel regions 1406 of the plurality of vertically stacked nanowires 1404. In one such embodiment, not depicted, the pair of non-discrete source or drain regions 1410/1412 is directly vertically adjoining for the channel regions 1406 in that epitaxial growth is on and between nanowire portions extending beyond the channel regions 1406, where nanowire ends are shown within the source or drain structures. In another embodiment, as depicted in FIG. 14A, the pair of non-discrete source or drain regions 1410/1412 is indirectly vertically adjoining for the channel regions 1406 in that they are formed at the ends of the nanowires and not between the nanowires.

In an embodiment, as depicted, the source or drain regions 1410/1412 are non-discrete in that there are not individual and discrete source or drain regions for each channel region 1406 of a nanowire 1404. Accordingly, in embodiments having a plurality of nanowires 1404, the source or drain regions 1410/1412 of the nanowires are global or unified source or drain regions as opposed to discrete for each nanowire. That is, the non-discrete source or drain regions 1410/1412 are global in the sense that a single unified feature is used as a source or drain region for a plurality (in this case, 3) of nanowires 1404 and, more particularly, for more than one discrete channel region 1406. In one embodiment, from a cross-sectional perspective orthogonal to the length of the discrete channel regions 1406, each of the pair of non-discrete source or drain regions 1410/1412 is approximately rectangular in shape with a bottom tapered portion and a top vertex portion, as depicted in FIG. 14B. In other embodiments, however, the source or drain regions 1410/1412 of the nanowires are relatively larger yet discrete non-vertically merged epitaxial structures such as nubs.

In accordance with an embodiment of the present disclosure, and as depicted in FIGS. 14A and 14B, integrated circuit structure 1400 further includes a pair of contacts 1414, each contact 1414 on one of the pair of non-discrete source or drain regions 1410/1412. In one such embodiment, in a vertical sense, each contact 1414 completely surrounds the respective non-discrete source or drain region 1410/1412. In another aspect, the entire perimeter of the non-discrete source or drain regions 1410/1412 may not be accessible for contact with contacts 1414, and the contact 1414 thus only partially surrounds the non-discrete source or drain regions 1410/1412, as depicted in FIG. 14B. In a contrasting embodiment, not depicted, the entire perimeter of the non-discrete source or drain regions 1410/1412, as taken along the a-a' axis, is surrounded by the contacts 1414.

Referring again to FIG. 14A, in an embodiment, integrated circuit structure 1400 further includes a pair of spacers 1416. As is depicted, outer portions of the pair of spacers 1416 may overlap portions of the non-discrete source or drain regions 1410/1412, providing for "embedded" portions of the non-discrete source or drain regions 1410/1412 beneath the pair of spacers 1416. As is also depicted, the embedded portions of the non-discrete source or drain regions 1410/1412 may not extend beneath the entirety of the pair of spacers 1416.

Substrate 1402 may be composed of a material suitable for integrated circuit structure fabrication. In one embodiment, substrate 1402 includes a lower bulk substrate composed of a single crystal of a material which may include, but is not limited to, silicon, germanium, silicon-germanium, germanium-tin, silicon-germanium-tin, or a group III-V compound semiconductor material. An upper insulator layer composed of a material which may include, but is not limited to, silicon dioxide, silicon nitride or silicon oxynitride is on the lower bulk substrate. Thus, the structure 1400 may be fabricated from a starting semiconductor-on-insulator substrate. Alternatively, the structure 1400 is formed directly from a bulk substrate and local oxidation is used to form electrically insulative portions in place of the above described upper insulator layer. In another alternative embodiment, the structure 1400 is formed directly from a bulk substrate and doping is used to form electrically isolated active regions, such as nanowires, thereon. In one such embodiment, the first nanowire (i.e., proximate the substrate) is in the form of an omega-FET type structure.

In an embodiment, the nanowires 1404 may be sized as wires or ribbons, as described below, and may have squared-off or rounder corners. In an embodiment, the nanowires 1404 are composed of a material such as, but not limited to, silicon, germanium, or a combination thereof. In one such embodiment, the nanowires are single-crystalline. For example, for a silicon nanowire 1404, a single-crystalline nanowire may be based from a (100) global orientation, e.g., with a <100> plane in the z-direction. As described below, other orientations may also be considered. In an embodiment, the dimensions of the nanowires 1404, from a cross-sectional perspective, are on the nano-scale. For example, in a specific embodiment, the smallest dimension of the nanowires 1404 is less than approximately 20 nanometers. In an embodiment, the nanowires 1404 are composed of a strained material, particularly in the channel regions 1406.

Referring to FIGS. 14C, in an embodiment, each of the channel regions 1406 has a width (Wc) and a height (Hc), the width (Wc) approximately the same as the height (Hc). That is, in both cases, the channel regions 1406 are square-like or, if corner-rounded, circle-like in cross-section profile. In another aspect, the width and height of the channel region need not be the same, such as the case for nanoribbons as described throughout.

Referring again to FIGS. 14A, 14B and 14C, in an embodiment, the lower portions of the structure 1400 can be planarized and/or etched to level 1499 in order to leave a backside surface including exposed bottom surfaces of gate structures and epitaxial source or drain structures. It is to be appreciated that backside (bottom) contacts may be formed on the exposed bottom surfaces of the epitaxial source or drain structures. In an embodiment, as described throughout, an integrated circuit structure includes non-planar devices such as, but not limited to, a finFET based device, a tri-gate based device, or a nanowire based device.

It is to be appreciated that, as used throughout the disclosure, a nanowire, a nanoribbon, or a fin described herein may be a silicon nanowire, a silicon nanoribbon, or a silicon fin. As used throughout, a silicon layer or structure may be used to describe a silicon material composed of a very substantial amount of, if not all, silicon. However, it is to be appreciated that, practically, 100% pure Si may be difficult to form and, hence, could include a tiny percentage of carbon, germanium or tin. Such impurities may be included as an unavoidable impurity or component during deposition of Si or may "contaminate" the Si upon diffusion during post deposition processing. As such, embodiments described herein directed to a silicon layer or structure may include a silicon layer or structure that contains a relatively small amount, e.g., "impurity" level, non-Si atoms or species, such as Ge, C or Sn. It is to be appreciated that a silicon layer or structure as described herein may be undoped or may be doped with dopant atoms such as boron, phosphorous or arsenic.

It is to be appreciated that, as used throughout the disclosure, a nanowire, a nanoribbon, or a fin described herein may be a silicon germanium nanowire, a silicon germanium nanoribbon, or a silicon germanium fin. As used throughout, a silicon germanium layer or structure may be used to describe a silicon germanium material composed of substantial portions of both silicon and germanium, such as at least 5% of both. In some embodiments, the amount of germanium is greater than the amount of silicon. In particular embodiments, a silicon germanium layer or structure includes approximately 60% germanium and approximately 40% silicon ($Si_{40}Ge_{60}$). In other embodiments, the amount of silicon is greater than the amount of germanium. In particular embodiments, a silicon germanium layer or structure includes approximately 30% germanium and approximately 70% silicon ($Si_{70}Ge_{30}$). It is to be appreciated that, practically, 100% pure silicon germanium (referred to generally as SiGe) may be difficult to form and, hence, could include a tiny percentage of carbon or tin. Such impurities may be included as an unavoidable impurity or component during deposition of SiGe or may "contaminate" the SiGe upon diffusion during post deposition processing. As such, embodiments described herein directed to a silicon germanium layer or structure may include a silicon germanium layer or structure that contains a relatively small amount, e.g., "impurity" level, non-Ge and non-Si atoms or species, such as carbon or tin. It is to be appreciated that a silicon germanium layer or structure as described herein may be undoped or may be doped with dopant atoms such as boron, phosphorous or arsenic.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 15:
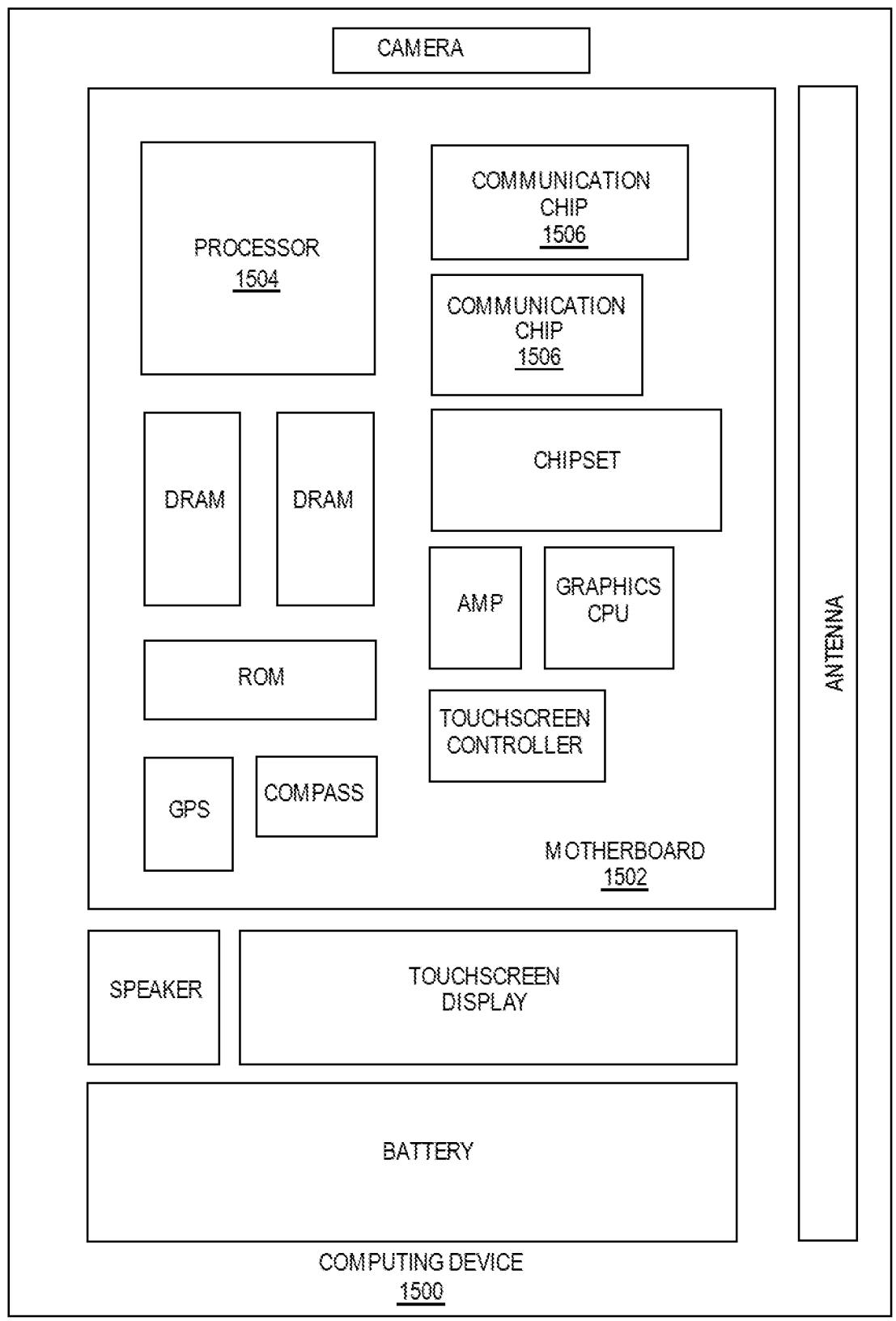
FIG. 15 illustrates a computing device in accordance with one implementation of an embodiment of the disclosure.

FIG. 15 illustrates a computing device 1500 in accordance with one implementation of an embodiment of the present disclosure. The computing device 1500 houses a board 1502. The board 1502 may include a number of components, including but not limited to a processor 1504 and at least one communication chip 1506. The processor 1504 is physically and electrically coupled to the board 1502. In some implementations the at least one communication chip 1506 is also physically and electrically coupled to the board 1502. In further implementations, the communication chip 1506 is part of the processor 1504.

Depending on its applications, computing device 1500 may include other components that may or may not be physically and electrically coupled to the board 1502. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1506 enables wireless communications for the transfer of data to and from the computing device 1500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1500 may include a plurality of communication chips 1506. For instance, a first communication chip 1506 may be dedicated to shorter range wireless communications such as Wi-Fi and Bluetooth and a second communication chip 1506 may be dedicated to longer range wireless communications such as GPS, EDGE, GPRS, CDMA, WiMAX, LTE, Ev-DO, and others.

The processor 1504 of the computing device 1500 includes an integrated circuit die packaged within the processor 1504. The integrated circuit die of the processor 1504 may include one or more structures, such as integrated circuit structures built in accordance with implementations of embodiments of the present disclosure. The term "processor" may refer to any device or portion of a device that processes electronic data from registers and/or memory to transform that electronic data into other electronic data that may be stored in registers and/or memory.

The communication chip 1506 also includes an integrated circuit die packaged within the communication chip 1506. The integrated circuit die of the communication chip 1506 may include one or more structures, such as integrated circuit structures built in accordance with implementations of embodiments of the present disclosure.

In further implementations, another component housed within the computing device 1500 may contain an integrated circuit die that includes one or structures, such as integrated circuit structures built in accordance with implementations of embodiments of the present disclosure.

In various implementations, the computing device 1500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1500 may be any other electronic device that processes data.

Figure 16:
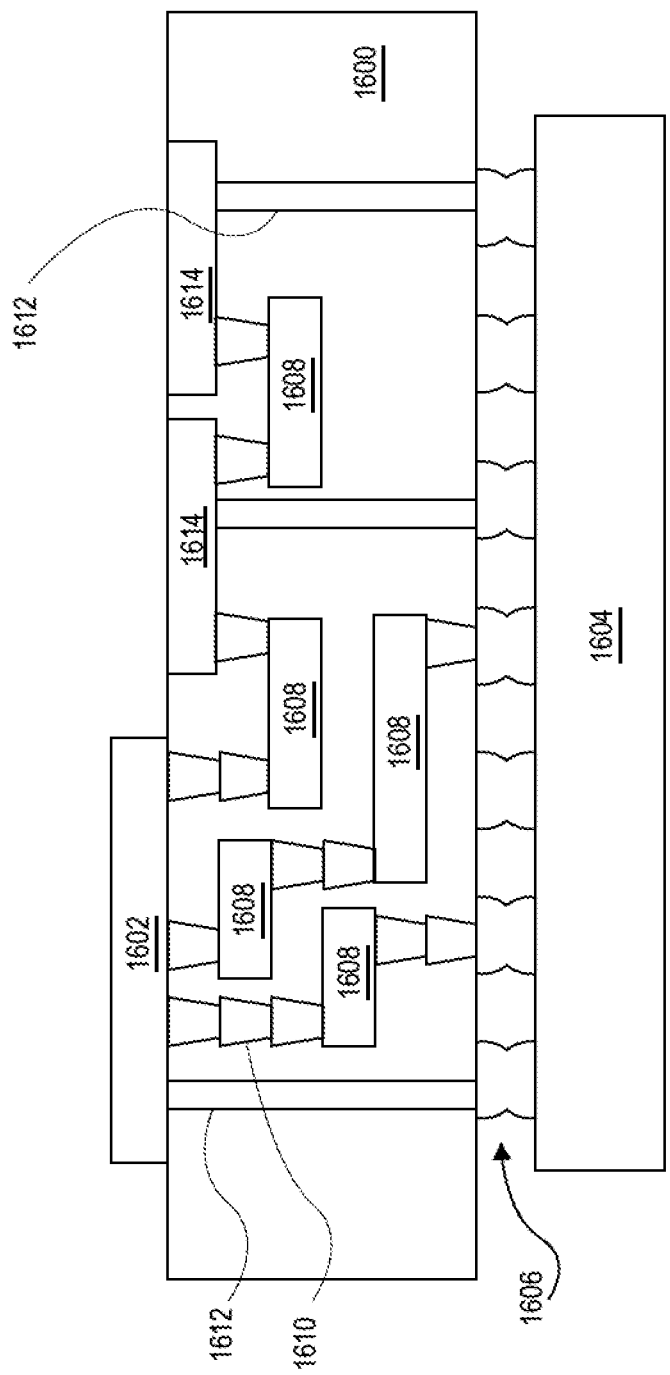
FIG. 16 illustrates an interposer that includes one or more embodiments of the disclosure.

FIG. 16 illustrates an interposer 1600 that includes one or more embodiments of the present disclosure. The interposer 1600 is an intervening substrate used to bridge a first substrate 1602 to a second substrate 1604. The first substrate 1602 may be, for instance, an integrated circuit die. The second substrate 1604 may be, for instance, a memory module, a computer motherboard, or another integrated circuit die. Generally, the purpose of an interposer 1600 is to spread a connection to a wider pitch or to reroute a connection to a different connection. For example, an interposer 1600 may couple an integrated circuit die to a ball grid array (BGA) 1606 that can subsequently be coupled to the second substrate 1604. In some embodiments, the first and second substrates 1602/1604 are attached to opposing sides of the interposer 1600. In other embodiments, the first and second substrates 1602/1604 are attached to the same side of the interposer 1600. And, in further embodiments, three or more substrates are interconnected by way of the interposer 1600.

The interposer 1600 may be formed of an epoxy resin, a fiberglass-reinforced epoxy resin, a ceramic material, or a polymer material such as polyimide. In further implementations, the interposer 1600 may be formed of alternate rigid or flexible materials that may include the same materials described above for use in a semiconductor substrate, such as silicon, germanium, and other group III-V and group IV materials.

The interposer 1600 may include metal interconnects 1608 and vias 1610, including but not limited to through-silicon vias (TSVs) 1612. The interposer 1600 may further include embedded devices 1614, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1600. In accordance with embodiments of the disclosure, apparatuses or processes disclosed herein may be used in the fabrication of interposer 1600 or in the fabrication of components included in the interposer 1600.

Thus, embodiments of the present disclosure include stitched dies having a cooling structure are described, and methods of fabricating stitched dies having a cooling structure are described.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example embodiment 1: An integrated circuit structure includes a first die including a first device layer and a first plurality of metallization layers over the first device layer. The integrated circuit structure also includes a second die including a second device layer and a second plurality of metallization layers over the second device layer, the second die separated from the second die by a scribe region. A common conductive interconnection is coupling the first die and the second die at a first side of the first and second dies. A plurality of microfluidic channels is coupled to the first side of the first and second dies.

Example embodiment 2: The integrated circuit structure of example embodiment 1, wherein the plurality of microfluidic channels are within a substrate coupled to the first side of the first and second dies.

Example embodiment 3: The integrated circuit structure of example embodiment 1, wherein the plurality of microfluidic channels are within the first and second dies.

Example embodiment 4: The integrated circuit structure of example embodiment 1, 2 or 3, wherein the common conductive interconnection is a signal line.

Example embodiment 5: The integrated circuit structure of example embodiment 1, 2 or 3, wherein the common conductive interconnection is a backside power rail.

Example embodiment 6: The integrated circuit structure of example embodiment 1, 2, 3, 4 or 5, wherein the first device layer and the second device layer are both logic device layers, or are both SRAM device layers.

Example embodiment 7: The integrated circuit structure of example embodiment 1, 2, 3, 4 or 5, wherein the first device layer is a logic device layer, and the second device layer is an SRAM device layer.

Example embodiment 8: An integrated circuit structure includes a first die including a first device layer and a first plurality of metallization layers over the first device layer. The integrated circuit structure also includes a second die including a second device layer and a second plurality of metallization layers over the second device layer, the second die separated from the second die by a scribe region. A common conductive interconnection is coupling the first die and the second die at a first side of the first and second dies. A heat spreader is coupled to the first side of the first and second dies.

Example embodiment 9: The integrated circuit structure of example embodiment 8, wherein the common conductive interconnection is a signal line.

Example embodiment 10: The integrated circuit structure of example embodiment 8, wherein the common conductive interconnection is a backside power rail.

Example embodiment 11: The integrated circuit structure of example embodiment 8, 9 or 10, wherein the first device layer and the second device layer are both logic device layers, or are both SRAM device layers.

Example embodiment 12: The integrated circuit structure of example embodiment 8, 9 or 10, wherein the first device layer is a logic device layer, and the second device layer is an SRAM device layer.

Example embodiment 13: A computing device includes a board and a component coupled to the board. The component includes an integrated circuit structure including a first die including a first device layer and a first plurality of metallization layers over the first device layer. The integrated circuit structure also includes a second die including a second device layer and a second plurality of metallization layers over the second device layer, the second die separated from the second die by a scribe region. A common conductive interconnection is coupling the first die and the second die at a first side of the first and second dies. A plurality of microfluidic channels is coupled to the first side of the first and second dies.

Example embodiment 14: The computing device of example embodiment 13, further including a memory coupled to the board.

Example embodiment 15: The computing device of example embodiment 13 or 14, further including a communication chip coupled to the board.

Example embodiment 16: The computing device of example embodiment 13, 14 or 15, further including a battery coupled to the board.

Example embodiment 17: The computing device of example embodiment 13, 14, 15 or 16, wherein the component is a packaged integrated circuit die.

Example embodiment 18: A computing device includes a board and a component coupled to the board. The component includes an integrated circuit structure including a first die including a first device layer and a first plurality of metallization layers over the first device layer. The integrated circuit structure also includes a second die including a second device layer and a second plurality of metallization layers over the second device layer, the second die separated from the second die by a scribe region. A common conductive interconnection is coupling the first die and the second die at a first side of the first and second dies. A heat spreader is coupled to the first side of the first and second dies.

Example embodiment 19: The computing device of example embodiment 18, further including a memory coupled to the board.

Example embodiment 20: The computing device of example embodiment 18 or 19, further including a communication chip coupled to the board.

Example embodiment 21: The computing device of example embodiment 18, 19 or 20, further including a battery coupled to the board.

Example embodiment 22: The computing device of example embodiment 18, 19, 20 or 21, wherein the component is a packaged integrated circuit die.

What is claimed is:

1. An integrated circuit structure, comprising:
   a first die comprising a first device layer and a first plurality of metallization layers over the first device layer;
   a second die comprising a second device layer and a second plurality of metallization layers over the second device layer, the second die separated from the second die by a scribe region;
   a common conductive interconnection coupling the first die and the second die at a first side of the first and second dies; and
   a plurality of microfluidic channels coupled to the first side of the first and second dies.

2. The integrated circuit structure of claim 1, wherein the plurality of microfluidic channels are within a substrate coupled to the first side of the first and second dies.

3. The integrated circuit structure of claim 1, wherein the plurality of microfluidic channels are within the first and second dies.

4. The integrated circuit structure of claim 1, wherein the common conductive interconnection is a signal line.

5. The integrated circuit structure of claim 1, wherein the common conductive interconnection is a backside power rail.

6. The integrated circuit structure of claim 1, wherein the first device layer and the second device layer are both logic device layers, or are both SRAM device layers.

7. The integrated circuit structure of claim 1, wherein the first device layer is a logic device layer, and the second device layer is an SRAM device layer.

8. An integrated circuit structure, comprising:
   a first die comprising a first device layer and a first plurality of metallization layers over the first device layer;
   a second die comprising a second device layer and a second plurality of metallization layers over the second device layer, the second die separated from the second die by a scribe region;
   a common conductive interconnection coupling the first die and the second die at a first side of the first and second dies; and
   a heat spreader coupled to the first side of the first and second dies.

9. The integrated circuit structure of claim 8, wherein the common conductive interconnection is a signal line.

10. The integrated circuit structure of claim 8, wherein the common conductive interconnection is a backside power rail.

11. The integrated circuit structure of claim 8, wherein the first device layer and the second device layer are both logic device layers, or are both SRAM device layers.

12. The integrated circuit structure of claim 8, wherein the first device layer is a logic device layer, and the second device layer is an SRAM device layer.

13. A computing device, comprising:
   a board; and
   a component coupled to the board, the component including an integrated circuit structure, comprising:
   a first die comprising a first device layer and a first plurality of metallization layers over the first device layer;
   a second die comprising a second device layer and a second plurality of metallization layers over the second device layer, the second die separated from the second die by a scribe region;
   a common conductive interconnection coupling the first die and the second die at a first side of the first and second dies; and
   a plurality of microfluidic channels coupled to the first side of the first and second dies.

14. The computing device of claim 13, further comprising:
   a memory coupled to the board.

15. The computing device of claim 13, further comprising:
   a communication chip coupled to the board.

16. The computing device of claim 13, further comprising:
   a battery coupled to the board.

17. The computing device of claim 13, wherein the component is a packaged integrated circuit die.

18. A computing device, comprising:
   a board; and
   a component coupled to the board, the component including an integrated circuit structure, comprising:
   a first die comprising a first device layer and a first plurality of metallization layers over the first device layer;
   a second die comprising a second device layer and a second plurality of metallization layers over the second device layer, the second die separated from the second die by a scribe region;
   a common conductive interconnection coupling the first die and the second die at a first side of the first and second dies; and
   a heat spreader coupled to the first side of the first and second dies.

19. The computing device of claim 18, further comprising:
   a memory coupled to the board.

20. The computing device of claim 18, further comprising:
   a communication chip coupled to the board.

21. The computing device of claim 18, further comprising:
   a battery coupled to the board.

22. The computing device of claim 18, wherein the component is a packaged integrated circuit die.

* * * * *